(12) United States Patent
Daniels

(10) Patent No.: US 9,941,450 B2
(45) Date of Patent: Apr. 10, 2018

(54) ROLL-TO-ROLL FABRICATED LIGHT SHEET AND ENCAPSULATED SEMICONDUCTOR DEVICE

(71) Applicant: John J. Daniels, Madison, CT (US)

(72) Inventor: John J. Daniels, Madison, CT (US)

(73) Assignee: ARTICULATED TECHNOLOGIES, LLC, Hobe Sound, FL (US)

( * ) Notice: Subject to any disclaimer, the term of this patent is extended or adjusted under 35 U.S.C. 154(b) by 0 days.

(21) Appl. No.: 15/186,401

(22) Filed: Jun. 17, 2016

(65) Prior Publication Data

US 2017/0038055 A1 Feb. 9, 2017

Related U.S. Application Data

(60) Provisional application No. 62/181,710, filed on Jun. 18, 2015.

(51) Int. Cl.
| | |
|---|---|
| H01L 33/62 | (2010.01) |
| H01L 33/56 | (2010.01) |
| H01L 23/00 | (2006.01) |
| H01L 33/64 | (2010.01) |
| F21Y 115/10 | (2016.01) |
| H01L 25/075 | (2006.01) |
| H01L 33/48 | (2010.01) |
| F21Y 105/10 | (2016.01) |

(52) U.S. Cl.
CPC .............. *H01L 33/56* (2013.01); *H01L 24/00* (2013.01); *F21Y 2105/10* (2016.08); *F21Y 2115/10* (2016.08); *H01L 25/0753* (2013.01); *H01L 33/486* (2013.01); *H01L 33/641* (2013.01)

(58) Field of Classification Search
USPC .................................. 362/311.02, 235, 382
See application file for complete search history.

(56) References Cited

U.S. PATENT DOCUMENTS

| | | | | |
|---|---|---|---|---|
| 3,943,217 A | * | 3/1976 | Rother | .................... C04B 26/14 264/122 |
| 2005/0151142 A1 | * | 7/2005 | Imai | ........................ H01L 24/97 257/81 |
| 2006/0163592 A1 | * | 7/2006 | Tsai | ..................... H01L 33/0079 257/94 |
| 2013/0271980 A1 | * | 10/2013 | Quirion | ................... F21V 31/00 362/235 |

(Continued)

*Primary Examiner* — Allyson Trail
(74) *Attorney, Agent, or Firm* — Handal & Morofsky LLC

(57) ABSTRACT

A bottom electrically conductive surface is disposed on the top surface of a substrate and a top electrically conductive surface disposed on the bottom surface of a superstrate. A bare die electronic device is disposed with at least one of its top conductor in direct electrical communication with the bottom electrically conductive surface and/or its bottom conductor in direct electrical communication with the top conductive surface. A non-conductive adhesive secures the substrate to the superstrate so that the bare die electronic device is retained in direct electrical communication. The non-conductive adhesive has a melting point temperature at least greater than a minimum operating temperature of the operating temperature range of the bare die, so that the non-conductive adhesive does not melt and flow thereby preventing a separation or degradation of the direct electrical connection of the bare die electronic device.

21 Claims, 15 Drawing Sheets

(56) References Cited

U.S. PATENT DOCUMENTS

| | | | | |
|---|---|---|---|---|
| 2014/0091697 A1* | 4/2014 | Shum | ................ | F21V 5/04 |
| | | | | 313/46 |
| 2015/0322257 A1* | 11/2015 | Hirano | ................ | C08L 63/00 |
| | | | | 428/414 |
| 2016/0013376 A1* | 1/2016 | Maki | ................ | H01L 25/0753 |
| | | | | 257/88 |
| 2016/0290609 A1* | 10/2016 | Jiang | ................ | F21V 11/00 |

* cited by examiner

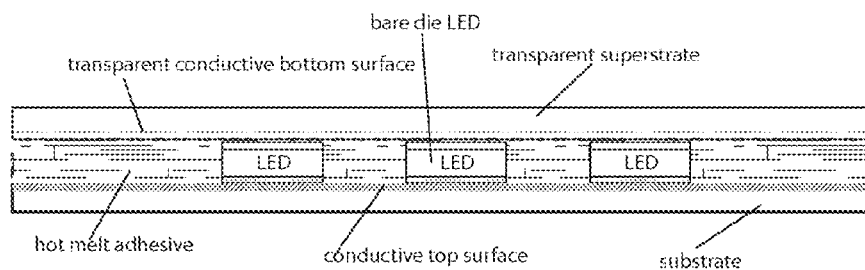
Figure 1(a) prior invention
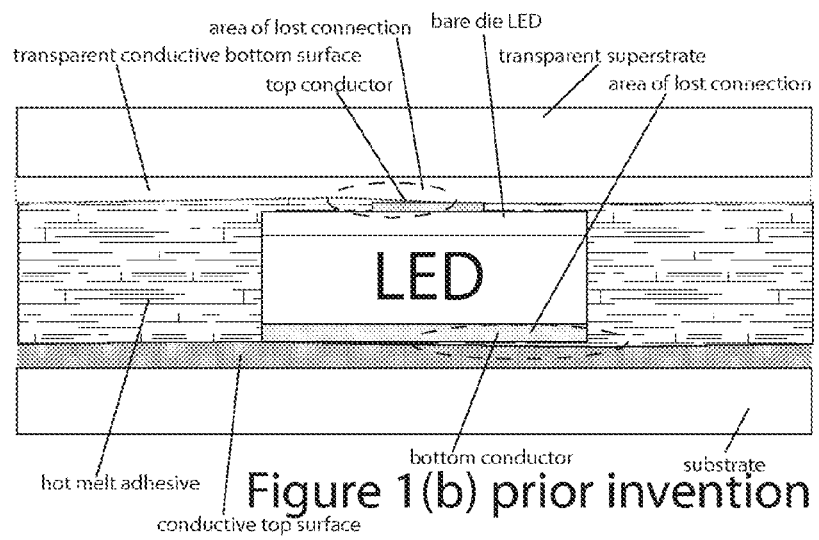
Figure 1(b) prior invention
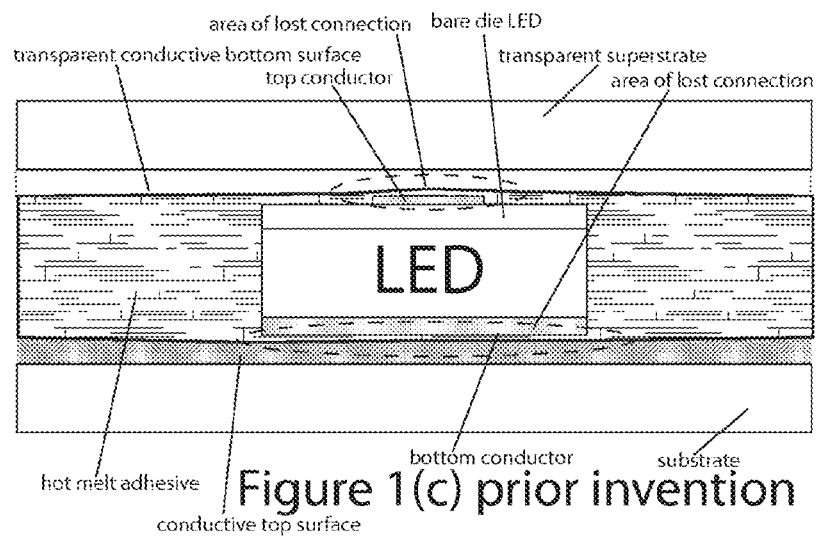
Figure 1(c) prior invention

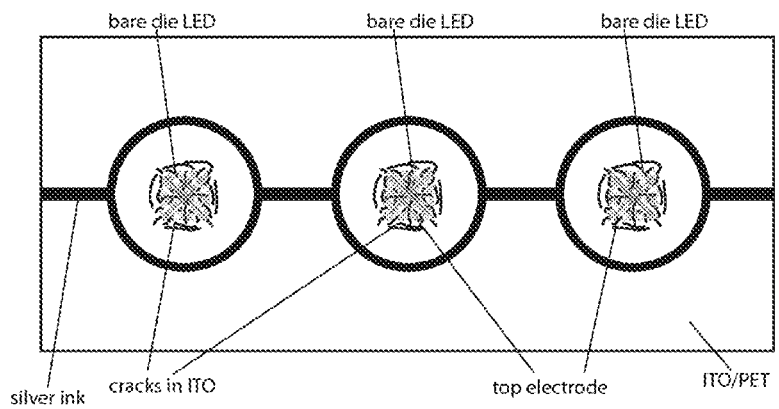
Figure 1(d) prior invention
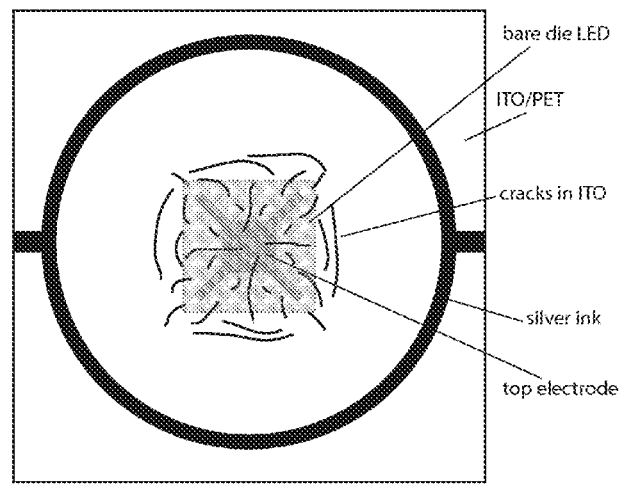
Figure 1(e) prior invention
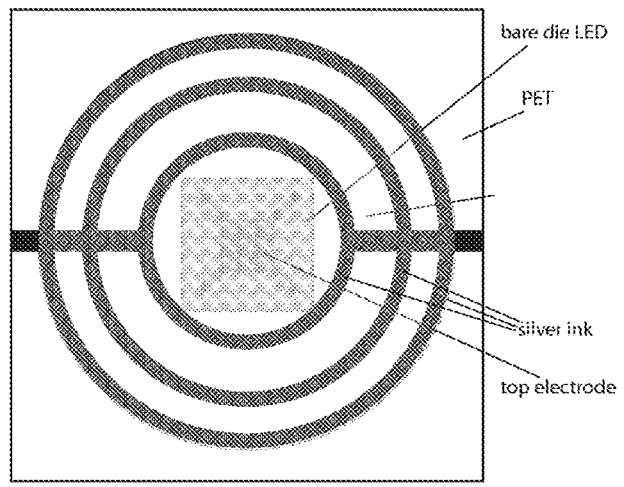
Figure 2(d)

etched printed circuit board — solder — non-conductive phase change material — packaged lamp

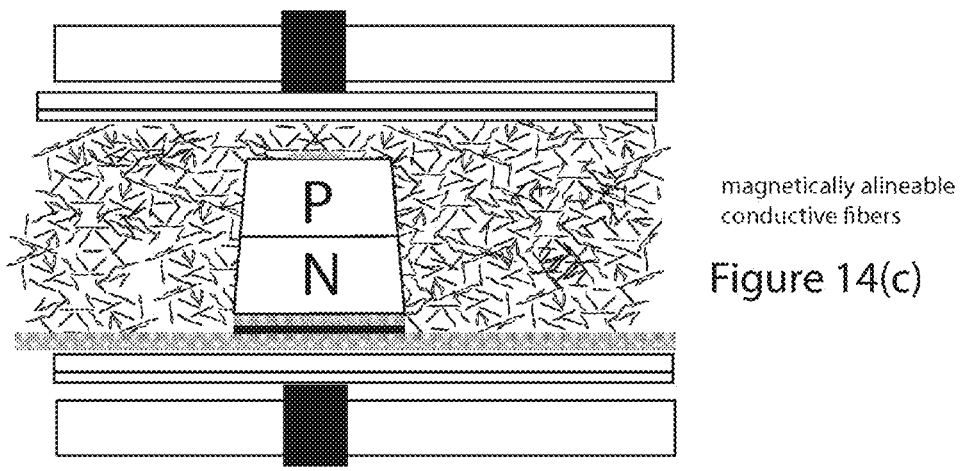

magnetically alineable conductive fibers

Figure 14(c)

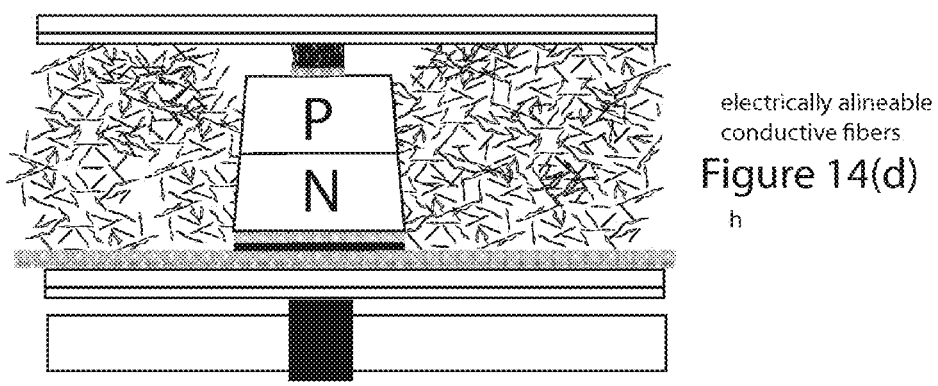

electrically alineable conductive fibers

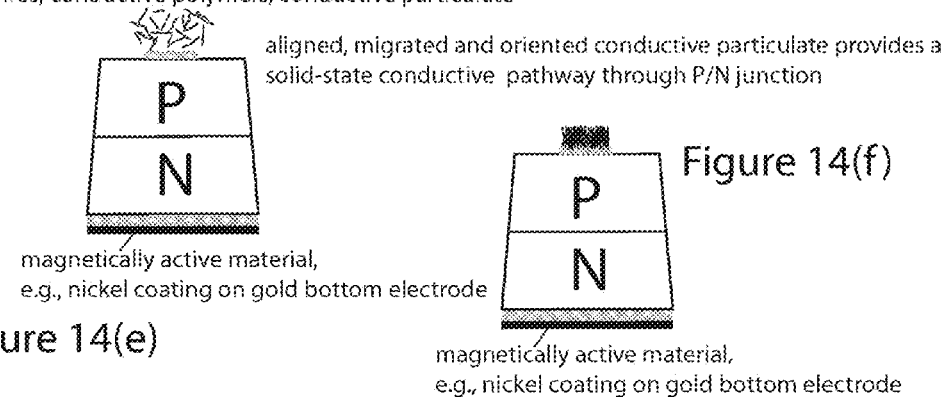

e.g., nanowires, conductive polymers, conductive particulate aligned, migrated and oriented conductive particulate provides a solid-state conductive pathway through P/N junction

Figure 14(f)

magnetically active material, e.g., nickel coating on gold bottom electrode

Figure 14(e)

magnetically active material, e.g., nickel coating on gold bottom electrode

ROLL-TO-ROLL FABRICATED LIGHT SHEET AND ENCAPSULATED SEMICONDUCTOR DEVICE

BACKGROUND

The inventor of the embodiments herein is the inventor of a number of methods and apparatuses for forming light emitting diode circuits without wire bonding or solder. Some of the prior US patents of the inventor disclosing related prior inventions include, among others in the US and internationally, U.S. Pat. Nos. 7,952,107, 7,858,994, 7,259,030, 7,294,961, 7,723,733, the disclosures of which are incorporated by reference herein.

The present invention pertains to method of forming a bare die LED light sheet. The inventive methods and apparatuses can be used to make a photo-radiation source for applications including, but not limited to, general illumination, architectural lighting, novelty lighting, display backlighting, heads-up displays, commercial and roadway signage, monochromatic and full-color static and video displays, a radiation-source for photo-curable materials, patterned light emissive images, scrolling displays, friend or foe identification, light sources for the transportation industry including trucks, cars, boats, airplanes, and the like. Further, the present invention can be used to make enhanced electronically active sheets utilizing bare die electronic semiconductor elements such as transistors, resistors, capacitors, etc.

Inorganic light emitting diodes (LED) are based on elements of the periodic table of a vast variety. They come out of semiconductor technology, and indeed, a semiconductor diode such as a silicon diode, or a germanium diode were among the first semiconductor devices. These were made by doping the silicon or the germanium with a small amount of impurity to make n-type (excess electrons) or p-type (excess holes) in the material. LEDs emit light because of the materials selected so that the light is emitted in the ultraviolet, visible, or infrared ranges of the spectrum. The types of materials used are made from vapor deposition of materials on semiconductor wafers and cut into dice (a single one is a die). Typically, the die, or LED dice, are about 12 mil sq. The composition of the dice depends on the color, for example some red dice are AlInGaAs and some blue dice are InGaN. The variations are typically "three-five" variations, so-called because the n- and p-type materials forming the diode are based on the third and fifth period of the periodic table.

The conversion of an LED die into an LED lamp is a costly process, involving very precise handling and placement of the tiny LED die. The LED dice are most simply prepared as 3 mm LED lamps. The die is robotically placed in a split cup with wire leads on each side. A bottom conductor of the die is fixed in electrical communication with the cup using, for example, a conductive adhesive or solder, with one wire lead integrally formed with the cup. The other wire lead is connected to a top conductor of die by wire bonding, where a thin wire is used to connect that top conductor to the other wire lead. The entire structure is 2 encased in a plastic lens that attempts to focus the beam more narrowly. High brightness dice may also be surface mounted with current-driving and voltage limiting circuits, and elaborate heat sink and heat removal schemes. The LED lamp has the pair of leads, which can then be soldered to a printed circuit board. Although the cost of the bare die can be fairly cost effective, the cost of forming the lamp and then soldering the lamp to a printed circuit board is a relatively expensive process.

The demand for more efficient solid-state lighting continues to grow. There is a growing desire to reduce the dollar and environmental costs associated with the formation of a conventional LED packaged lamp or chip-on-board array used by these solid-state light bulbs. Accordingly, there is a need to reduce the cost of forming a light emitting device based on the LED die.

A common failure mechanism for electronic circuits occurs due to thermal cycling caused by heat generated during the operation of the circuit. Conventionally, heat sinks are used to draw heat away from the electronic circuits and transfer the heat as efficiently and quickly as practical to the ambient. A fan is often used to facilitate removing heat from the heat sink.

As an example of a recent prior attempt providing a commercially available LED lighting solution in the transportation industry, Grote Industries of Madison, Ind., has introduced LED designs that combine dual functions using long life LED technology, to create an obvious but useful step forward where stop/signal/tail and back-up lighting functions are combined in a single unit. Grote claims that replacing conventional incandescent lamps with modern LEDs results in a lamp that can last the life of the vehicle it's installed on. However, even this recent attempt to provide an LED lighting solution for the transportation industry fails to provide effective shock proofing, thermal management and water proofing to consistently and effectively withstand many of the environmental, ambient and service conditions that a lighting device experiences, for example, when used as a stop/signal/tail and back-up on a highway bound tractor tailer. Failure of any of these critical functional features of the conventional lighting device can result in a catastrophic accident, leading to considerable losses in terms of material goods, vehicles, personal injuries and even death.

Accordingly, there is a need to provide an improvement to the LED lighting solutions that are commercially available for industries, such as the transportation industry.

SUMMARY OF THE INVENTION

The present invention is intended to overcome the drawbacks of the prior attempts and provide a remedy. In accordance with the a non-limiting, exemplary embodiment, a substrate has a bottom electrically conductive surface disposed on a top of the substrate. A superstrate has a top electrically conductive surface disposed on a bottom of the superstrate. A bare die electronic device has a top conductor and a bottom conductor. At least one of the top conductor is in direct electrical communication with the bottom electrically conductive surface and/or the bottom conductor is in direct electrical communication with the top conductive surface. During operation, the bare die electronic device generates heat having an operating temperature range. A non-conductive adhesive secures the substrate to the superstrate so that the bare die electronic device is retained in direct electrical communication with at least one of the bottom electrically conductive surface and the top electrically conductive surface. The non-conductive adhesive has a melting point temperature at least greater than a minimum operating temperature of the operating temperature range, so that during an operation of the bare die electronic device the non-conductive adhesive does not melt and flow between at least one of the top conductor and the bottom electrically conductive surface, and/or the bottom conductor and the top electrically conductive surface thereby preventing a separation or degradation of the direct electrical communication of the bare die electronic device with said at least one of the bottom electrically conductive surface and the top electrically conductive surface.

In accordance with another non-limiting, exemplary embodiment, a substrate has a top electrically conductive surface disposed on a top of the substrate, where the substrate includes a connection land in electrical communication with the conductive surface, each connection land including an electrically conductive phase change material disposed thereon. A superstrate has a bottom electrically conductive surface disposed on a bottom of the superstrate. A bare die electronic device has a top conductor and a bottom conductor. The top conductor is in electrical communication with the bottom electrically conductive surface and the bottom conductor is in electrical communication with the top conductive surface through the electrically conductive phase change material. If the bare die electronic device is driven with a wattage causing a temperature of the bottom conductor to reach a melting point of the phase change material at least a portion of the phase change material between the bottom conductor and the top electrically conductive surface melts to remove heat from the bare die LED by transferring heat energy from the bottom conductor through the phase change material to the top electrically conductive surface.

BRIEF DESCRIPTION OF THE DRAWINGS

FIG. 1(a) is a cross sectional view showing an embodiment of a prior invention;

FIG. 1(b) is an isolated view showing a bare die LED electrically connected in accordance with the prior invention, showing melted adhesive starting to separate electrical connections to the bare die LED;

FIG. 1(c) is a cross sectional view showing the bare die with the electrical connections to the bare die LED becoming separated and degraded due to the melting adhesive;

FIG. 1(d) shows a top plan view of a second failure mode of the prior invention showing cracks forming in the transmissive conductive surface;

FIG. 1(e) shows a close up top plan view of a bare die showing cracks forming in the transmissive conductive surface;

FIG. 2(d) shows an improved top connection for mitigating the cracked transmissive conductive surface with a flexible.

FIG. 14(c) shows a bare die LED disposed within an unhardened binder with randomly dispersed magnetically attractive electrically conductive filaments;

FIG. 14(d) shows a bare die LED disposed within a hardened binder with electrically aligned magnetically attractive electrically conductive filaments;

FIG. 14(e) shows a bare die LED with randomly dispersed attractive electrically conductive filaments at the site of the top conductor;

FIG. 14(f) shows a bare die LED with aligned attractive electrically conductive filaments at the site of the top conductor;

DETAILED DESCRIPTION OF THE INVENTION

Figure 2A:
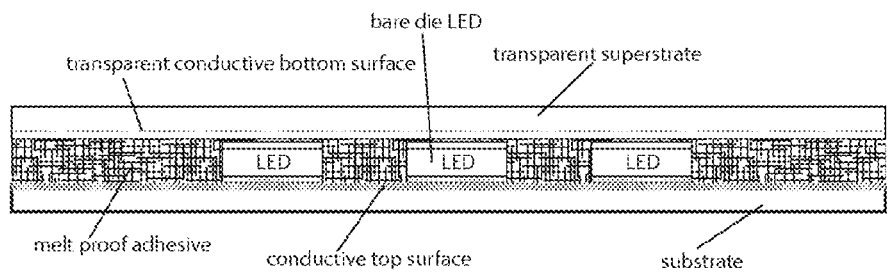
FIG. 2(a) is a cross sectional view of a non-limiting, exemplary embodiment.

The inventor of the subject matter herein is also the inventor of methods and apparatuses for connecting bare die electronics, including light emitting diodes, disposed between planar electrically conductive surfaces without wire bonds or solder. FIG. 1(a) is a cross sectional view showing an embodiment of a device constructed in accordance with the inventor's prior invention. An LED converts electrical energy into light by recombining charge carriers (electrons and holes) at or adjacent to the LED's junction (p/n junction). Even though LEDs are relatively efficient, approximately 65-75% of the electrical energy consumed still generates heat rather than light, raising the temperature of the bare die. The inventor has recognized that his prior invention, where bare die LEDs are embedded within a hot melt adhesive, suffers from negative effects caused by the electrical connection to the bare die LED conductors becoming separated and degraded due to the melting adhesive. There are areas of lost connection, as shown in FIG. 1(b), that occur where molten adhesive makes its way via capillary action or pressure to cause a degradation in the electrical connections with the bare die LED. The bare die LEDs are very small sources of heat, and during operation, hot inch adhesive locally disposed around the bare die LED is caused to melt due to the heat generated by the LED. The melted adhesive then has a tendency to flow, through capillary or other action, between the electrical conductors of the LED and conductive surfaces that are in electrical communication with the conductors, resulting in a significant performance and service life problem that is in need of a complete solution. During operation, the bare die electronic device generates heat having an operating temperature range. The operating temperature range of the bare die LED is represented by the thermometer shown in FIG. 1(b), low end of the operating range and FIG. 1(c), high end of the operating range.

FIG. 1(b) shows a bare die LED electrically connected in accordance with the prior invention, showing melted adhesive starting to separate electrical connections to the bare die LED. The representation of the thermometer in the Figure indicates the elevated temperature experienced in the local area around the LED when the LED is driven to produce at least a minimum of useful light. The flow of the melted hot melt adhesive is exacerbated as the LED is driven harder to produce more intense useful light. As indicated by the representation of the thermometer in FIG. 1(c) when the LED is driven harder and the hot melt adhesive becomes more fluid, and/or stresses are applied causing the hot melt adhesive to flow, such as bending the device the electrical connections to the bare die LED becoming separated and degraded due to the melting adhesive. The areas of lost connection, as shown in FIG. 1(c), show what happens when the molten adhesive makes its way to completely separate the electrical connections with the bare die LED. These areas where the adhesive becomes molten due to the heat generated by the bare die LED and flows creates electron flow bottlenecks (as shown in FIG. 1(b)) and catastrophic failure sites (as shown in FIG. 1(c)).

FIG. 1(d) shows a top plan view of a second failure mode of the prior invention showing cracks forming in the transmissive conductive surface. The transmissive conductive surface is typically a brittle film of a transparent conductor such as indium tin oxide (ITO). Cracks, scratches and other defects tend to form during the manufacture process, during handling and during service operation. These cracks likely increase resistance and constrain the flow of electrons through the p/n junction of the bare die LED. FIG. 1(e) shows a close up top plan view of a bare die showing cracks forming in the transmissive conductive surface. A conduction facilitating pattern can be printed around the location where the bare die LED is connected to the bottom conductive surface to reduce the effects of the sheet resistance of the unpatterned surface area of transmissive conductor connecting the bare die LED to power. However, even with the conduction facilitating pattern reducing the resistance, the cracks formed in the ITO, for example, become electron flow bottlenecks and then catastrophic failure sites. The prior invention, while very effective at avoiding much of the costs and failure modes associated with conventional packaged semiconductor device soldered to a printed circuit board, have some lingering causes of lost connection that limit the commercial effectiveness of the prior invention, including cracking of ITO; capillary action of locally melted adhesive separating the electrical connection(s) to the bare die; and the physical separation caused, for example, by bending or other service, storage and installation stresses experienced by the assembled bare die electronic device. As described herein, the exemplary embodiments overcome these limitations on the commercial effectiveness of the prior invention, and result in an assembled bare die electronic device that has superior manufacturing, dimensional, service and efficiency characteristics as compared to the prior invention as well as compared to the prior attempts of others.

FIG. 2(a) is a cross sectional view of a non-limiting, exemplary embodiment, the thermometer represents the temperature of the device before being turned on. In accordance with the a non-limiting, exemplary embodiment, a substrate has a bottom electrically conductive surface disposed on a top of the substrate. A superstrate has a top electrically conductive surface disposed on a bottom of the superstrate. A bare die electronic device has a top conductor and a bottom conductor. At least one of the top conductor is in direct electrical communication with the bottom electrically conductive surface and/or the bottom conductor is in direct electrical communication with the top conductive surface. During operation, the bare die electronic device generates heat having an operating temperature range.

A non-conductive adhesive secures the substrate to the superstrate so that the bare die electronic device retained in direct electrical communication with at least one of the bottom electrically conductive surface and the top electrically conductive surface.

Figure 2B:
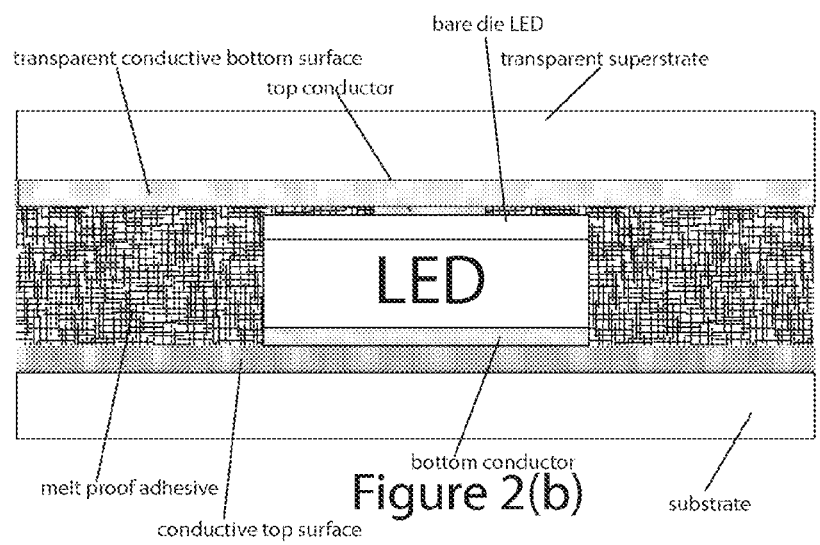
FIG. 2(b) is a cross sectional view showing a bare die LED electrically connected between a top conductive surface and a bottom conductive surface with a heat proof adhesive maintaining the direct electrical connection to the bare die LED during a lower end of an operational temperature range.
Figure 2C:
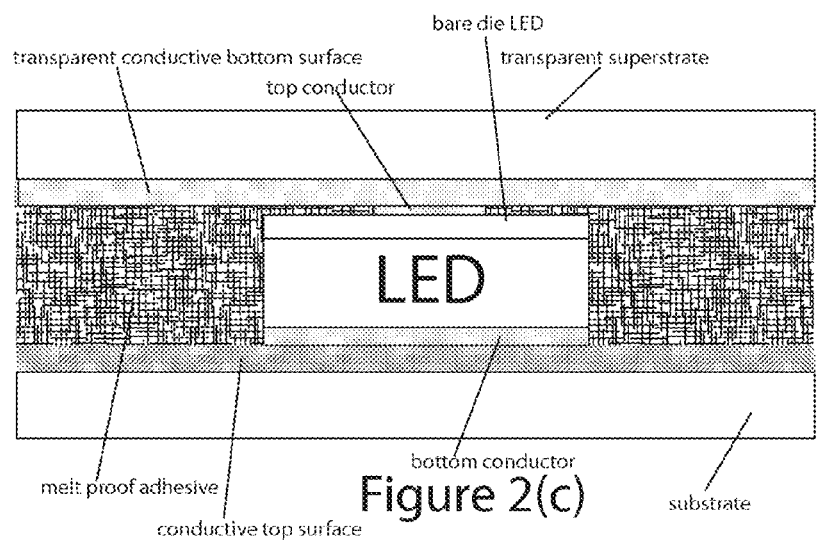
FIG. 2(c) is a cross sectional view showing the bare die LED electrically connected between a top conductive surface and a bottom conductive surface with a heat proof adhesive maintaining the direct electrical connection to the bare die LED during a higher end of the operational temperature range.

FIG. 2(b) is a cross sectional view showing a bare die LED electrically connected between a top conductive surface and a bottom conductive surface with a heat proof adhesive maintaining the direct electrical connection to the bare die LED during a lower end of an operational temperature range. FIG. 2(c) is a cross sectional view showing the bare die LED electrically connected between a top conductive surface and a bottom conductive surface with a heat proof adhesive maintaining the direct electrical connection to the bare die LED during a higher end of the operational temperature range. The operating temperature range of the bare die LED is represented by the thermometer shown in FIG. 2(b), low end of the operating range and FIG. 2(c), high end of the operating range.

The non-conductive adhesive has a melting point temperature at least greater than a minimum operating temperature of the operating temperature range (represented by the thermometer shown in FIG. 2(c), so that during an operation of the bare die electronic device the non-conductive adhesive does not melt and flow between at least one of the top conductor and the bottom electrically conductive surface, and/or the bottom conductor and the top electrically conductive surface thereby preventing a separation or degradation of the direct electrical communication of the bare die electronic device with said at least one of the bottom electrically conductive surface and the top electrically conductive surface. The non-conductive adhesive retains the bare die electronic device in electrical connection (either directly or through an intermediate such as a conductive phase change material, described below). Even if the bare die electronic device is driven hard and generates considerable heat in the local volume around the bare die electronic device, the non-conductive adhesive remains in an unmelted state and the problems of the previous invention, as shown, for example, in FIGS. 1(a)-1(c) are avoided. Specifically, the negative effects caused by the bare die LED becoming separated and degraded due to the melting adhesive flowing into the space above the top conductor and/or the space below the bottom conductor do not occur because the adhesive is selected so as to have a high enough melting point to prevent it from become molten and capable of flowing. Thus, in accordance with the present invention, the problem recognized by the inventor regarding the adhesive melting and flowing, through capillary or other action, between the electrical conductors of the LED and conductive surfaces that are in electrical communication with the conductors does not occur resulting in a significant improvement over the previous invention.

The bare die electronic device may be a light emitting diode for generating light output during the operation. During the operation a minimum light generating temperature (represented for example, by the thermometer in FIG. 2(b)) is generated when the light emitting diode generates a minimum useful light output and a maximum light generating temperature (represented for example, by the thermometer in FIG. 2(c)) is generated when the light emitting diode generates a maximum useful light output. The melting point of the non-conductive adhesive is at least greater than the minimum light generating temperature. An LED's hotspot is defined as the junction between p- and n-type semiconductors that form the diode. The melting point temperature can be between the minimum light generating temperature and the maximum light generating temperature. The maximum junction temperature (Tj) attained with a given power input is determined by three factors—ambient temperature, thermal resistance between the p/n junction and its surroundings, and the power dissipated by the bare die. In accordance with a non-limiting embodiment, the melting point of the adhesive exceeds at least the maximum operating temperature of the heat generated by the hot ext porting of the LED, which is typically the p-n junction. Since the heat absorbing material is in direct contact with the p-n junction and other hot areas of the bare die, the removal of heat is exceptionally efficient as compared with the conventional packaged lamp structure where the hottest parts of the bare die are typically surrounded by an insulate material such as an epoxy potting material. The utilization of heat absorbing and in particular phase chance materials enables highly efficient heat transfer away from the bare die to reduce the detrimental effects of thermal shock at the interfaces between materials and within the bulk materials making up with bare die and the other components of the inventive lighting device.

FIG. 2(d) shows a top plan view of an embodiment for overcoming the second failure mode of the prior invention where cracks form in the transmissive conductive surface. FIG. 1(d) shows a close up top plan view of the bare die showing a flexible, transmissive conductive film printed over multi-concentric circles forming a conduction facilitating pattern printed around the location where the top conductor of the bare die LED is connected. The concentric circles help overcome resistance in the flexible transmissive conductive film, and reduce the effects of the sheet resistance of the ITO, overcoming or at least mitigating against, for example, the prior invention electron flow bottlenecks and catastrophic failure sites.

Figure 3A:
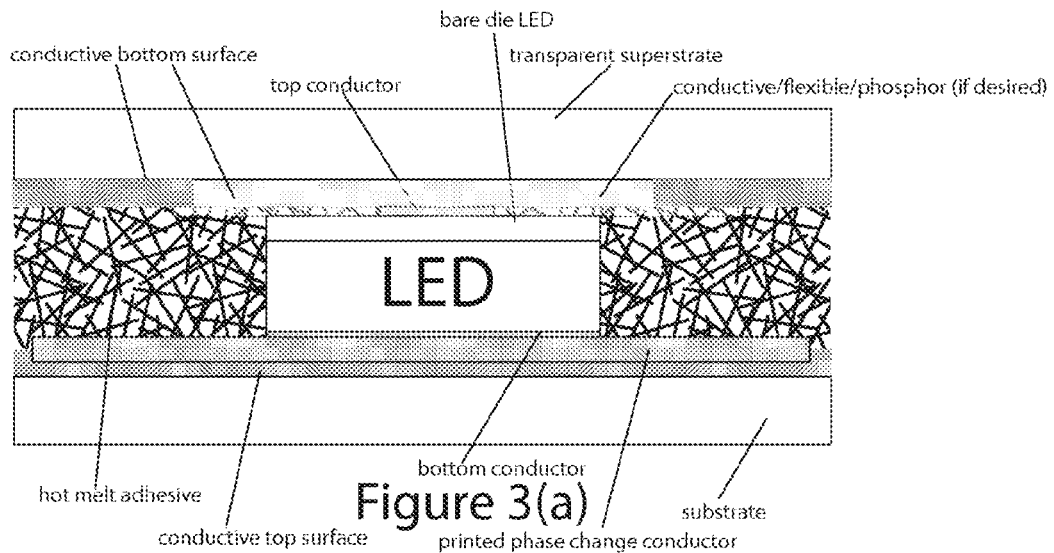
FIG. 3(a) is a cross sectional view of another non-limiting exemplary embodiment.
Figure 3B:
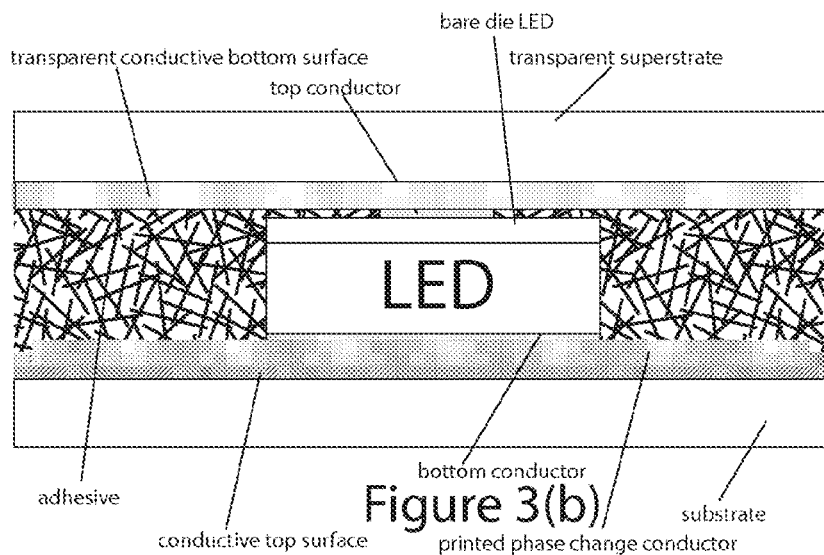
FIG. 3(b) is a cross sectional view showing a bare die LED having a bottom conductor electrically connected to a top conductive surface through an electrically conductive phase change material.
Figure 3C:
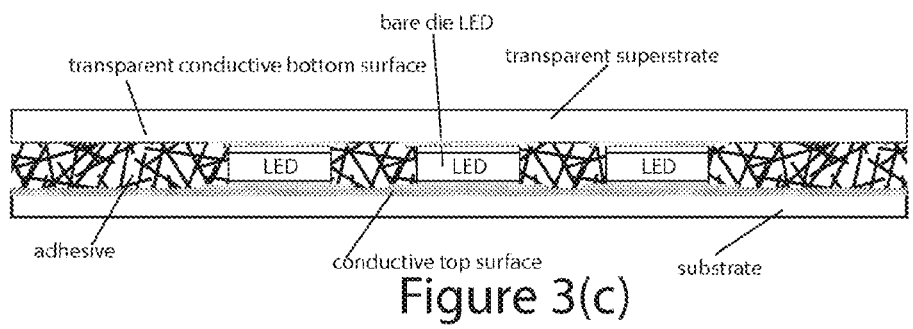
FIG. 3(c) is a cross sectional view showing a bare die LED having a top conductor electrically connected to a bottom conductive surface through an electrically conductive phosphor material.

FIG. 3(a) is a cross sectional view showing a bare die LED having a top conductor electrically connected to a bottom conductive surface through an electrically conductive, flexible phosphor material, where a hot melt adhesive with strength enhancing fibers binds the superstrate to the substrate with the electrically conductive phase change material. FIG. 3(b) is a cross sectional view showing a bare die LED having a bottom conductor electrically connected to a top conductive surface through an electrically conductive phase change material. FIG. 3(c) is a cross sectional view of another non-limiting exemplary embodiment where at least one of the substrate and the superstrate can be transmissive to light, and the bare die electronic device comprise a light emitting diode. For example, indium tin oxide can be used as a transparent conductor applied to a clear polyester superstrate.

The adhesive may comprise a hot melt adhesive having a melting point above the minimum operating temperature and having heat absorbing particulate. Heat absorbing particulate can be included to absorb the heat generated as the bare die electronic device reaches towards its maximum operating temperature to lessen thermal shocks to the individual component structures of the bare die device, the mechanical connections between the individual component structures of the bare die device, the in component structures of the apparatus, and the mechanical connections between the individual component structures of the apparatus. The heat absorbing particulate can include at least one of a powdered stone, powdered metal, insulated coated powdered metal, moisture absorbing material, a particulate of a phase change material, and powdered polymer. The adhesive and/or the heat absorbing particulate can have a latent heat storage capacity that is effective to remove heat from the bare die and transfer the heat energy to the substrate or other structures so that the heat from the bare die is efficiently removed while reducing thermal shock experienced by the components of the bare die and the rest of the components of the inventive lighting device.

Figure 3D:
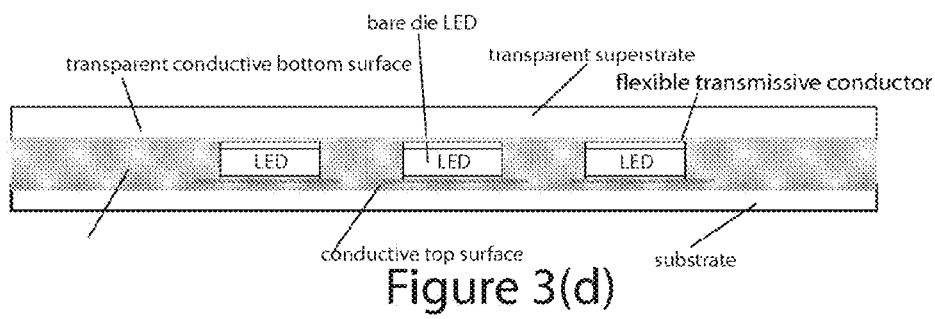
FIG. 3(d) is a cross sectional view of another non-limiting exemplary embodiment.
Figure 3E:
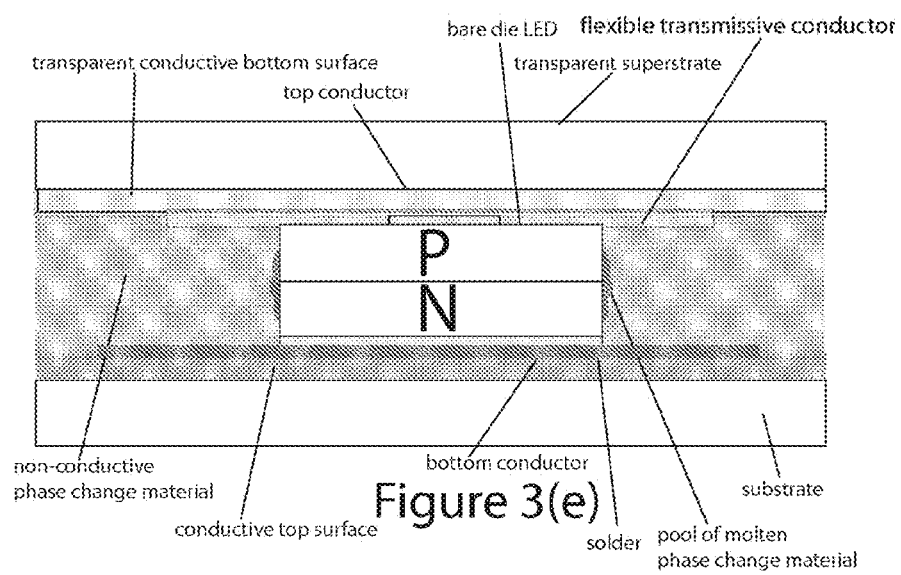
FIG. 3(e) is a cross sectional view showing a bare die LED embedded in an electrically non conductive phase change material adhering the substrate to the superstrate.
Figure 3F:
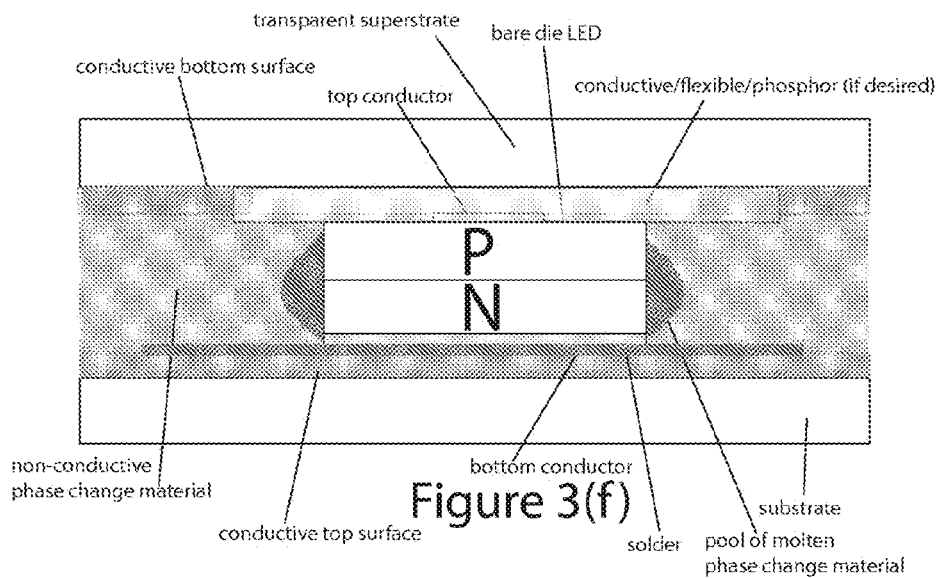
FIG. 3(f) is a cross sectional view showing a bare die LED embedded in a phase change material and having a top conductor electrically connected to a bottom conductive surface through an electrically conductive phosphor material.

FIG. 3(d) is a cross sectional view of another non-limiting exemplary embodiment. FIG. 3(e) is a cross sectional view showing a bare die LED embedded in an electrically non conductive phase change material adhering the substrate to the superstrate. FIG. 3(f) is a cross sectional view showing a bare die LED embedded in a phase change material and having a top conductor electrically connected to a bottom conductive surface through an electrically conductive flexible, phosphor transmissive material. The electrically conductive transmissive material may be loaded, for example, with indium tin oxide flakes, fibers or particulate, carbon nano wires, or other fine and or transmissive electrically conductive materials disposed in a suitable binder. The electrically conductive transmissive material may be screen or inkjet printed, doctor bladed, squeegeed or otherwise formed as a conductive and crack mitigating or preventing bridge for the flow of electrons through the p/n junction. When operating towards the lower end of the operating range for the bare die LED, a pool of phase change material may form in an area near the hottest part of the bare die LED, namely the p/n junction (e.g., FIG. 3(e)). When operating at towards the higher end of the operating range for the bare die LED, the pool of phase change material maybe larger to absorb the additional heat generated, predominantly, at the p/n junction. In accordance with the exemplary embodiments, the bare die LED can be surrounded by phase change material or heat absorbing material and provide a significant improvement in thermal management over the prior invention and also over the conventional packaged lamp LED, where multiple layers of insulating materials are typically between the source of the heat (e.g., p/n junction) and the ambient environment.

Suitable phase change materials can be obtained commercially from companies such as PureTemp, Honeywell, Rubitherm GmbH, Climator, Mitsubishi Chemicals, Cristopia, TEAP, Micronal, PlusICE, SAVENRG, Microtek. The phase change materials may be inorganic or organic based, microencapsulated, bulk, waxes, low temperature solder, eutectic, or other suitable composition effective to remove heat directly from the bare die or packaged semiconductor devices and provide for the thermal transfer of the heat to outside the assembled electronic device. There are many materials and formulations of phase change materials to choose from, including the following materials, listed with their respective melting points: Paraffin 31-Carbons 68 C; Stearic acid 69.4 C; Paraffin 32-Carbons 69.5 C; Na2SiO3.5H2O 72.20 C; Paraffin 33-Carbons 73.9 C; Paraffin 34-Carbons 75.9 C; Durene 79.3 C; Alpha napthol 96 C; Glautaric acid 97.5 C; p-Xylene dichloride 100 C; Methyl fumarate 102 C; Catechol 104.3 C; Quinone 115 C; and Benzamide 127.2 C. The phase change material is selected depending for example, on the compatibility with the binder or adhesive, other additives, the operational temperature range of the bare die, and other characteristics and materials used in manufacturing the assembled electronic device. Some of the exemplary embodiments show the phase change material also providing a conductive pathway for electrons to flow to the p/n junction of, for example, a bare die LED. In this case, the phase change material may be, for example a low temperature solder or metal alloy, such as Indalloy available from the Indium Corporation. In other embodiments, the phase change material needs to be non-conductive, for example, the Laird makes a number of non-electrically conductive phase change materials, including TPCM FSF 52, which can be provided as a free standing sheet and may be particularly effective as a phase change material layer used in the roll-to-roll manufacturing process described herein.

Figure 4:
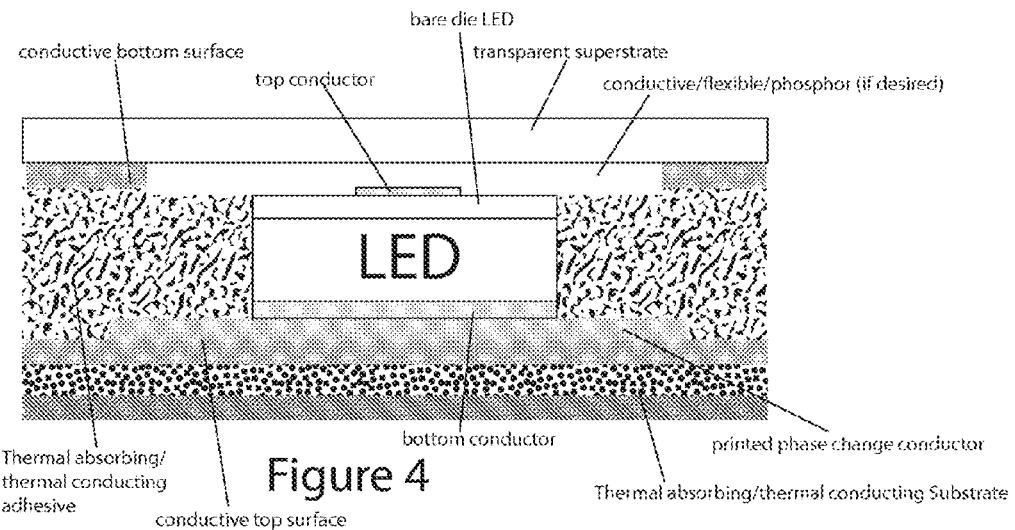
FIG. 4 is a cross sectional view showing a bare die LED embedded in a thermal absorbing, thermal conducting adhesive and mounted on a thermal absorbing, thermal conducting printed circuit board substrate.

FIG. 4 is a cross sectional view showing a bare die LED embedded in a thermal absorbing, thermal conductive adhesive and mounted on a thermal absorbing, thermal conducting printed circuit board substrate. In the case of the phase change material, for example, the adhesive encapsulates small domains of the phase change particulate and prevents a quantity of the phase change material from flowing between the bare die device and the top and bottom electrically conductive surfaces to the extent where it would cause a separation or degradation of the direct electrical communication of the bare die electronic device with said at least one of the bottom electrically conductive surface and the top electrically conductive surface.

The heat of fusion in the freeze/thaw cycles of the phase change material provides a "shock absorber". In accordance with the embodiment shown, for example, in FIG. 4, in particular, the latent heat of fusion of the phase change materials (e.g., the domains in the adhesive, and the electrically conductive phase change material) are particularly effective due to the bare die LED being nearly completely embedded with the phase change materials in direct thermal contact. The melting point of the phase change material creates a limit for the peak junction temperature provided there is enough material to absorb a significant enough portion or all of the heat in a drive pulse and enough inactive time to release the heat and refreeze the phase change material. The phase change material also keeps the bare die LED temperature from falling rapidly, which isothermalizes the bare die over the duty cycle to maintain a more constant temperature and improve the overall reliability and longevity of the device in service.

Also, the adhesive can have strength improving fibers incorporated within the adhesive bulk. The adhesive may comprise a two part epoxy having finely divided soapstone heat absorbing particulate, where the epoxy is disposed over the top conductive surface of the substrate and allowed to partially harden before the bare die electronic devices are placed onto the partially hardened epoxy, driven under pressure (e.g., from a press or roll laminator) and forced into or otherwise forming electrical contact completing a circuit through the p/n junction.

Figure 5:
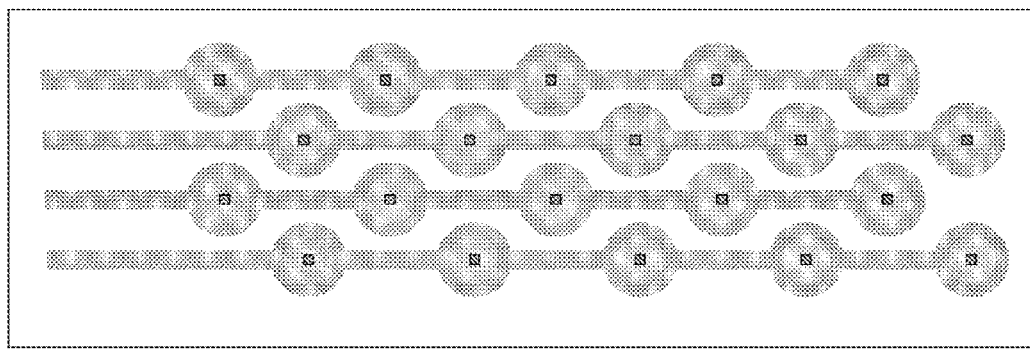
FIG. 5 is a top plan view showing connection lands having a surface area in direct thermal contact with electrically conductive phase change material, showing the surface area significantly larger than the bottom conductor of the bare die electronic device.

FIG. 5 is a top plan view showing connection lands having a surface area in direct thermal contact with electrically conductive phase change material, showing the surface area significantly larger than the bottom conductor of the bare die electronic device. In accordance with another non-limiting, exemplary embodiment, a substrate has a top electrically conductive surface disposed on a top of the substrate, where the substrate includes a connection land in electrical communication with the conductive surface, each connection land including an electrically conductive phase change material disposed thereon. A superstrate has a bottom electrically conductive surface disposed on a bottom of the superstrate. Each bare die LED is provided in direct thermal and electrical connection with the electrically conductive leads (conductive surface) and the electrically conductive phase change material providing significant heat absorption and dissipation for heat exiting the bare die from the bottom conductor.

A bare die electronic device has a top conductor and a bottom conductor. The top conductor is in electrical communication with the bottom electrically conductive surface and the bottom conductor is in electrical communication with the top conductive surface through the electrically conductive phase change material. If the bare die electronic device is driven with a wattage causing a temperature of the bottom conductor to reach a melting point of the phase change material at least a portion of the phase change material between the bottom conductor and the top electrically conductive surface melts to remove heat from the bare die electronic device by transferring heat energy from the bottom conductor through the phase change material to the top electrically conductive surface. The bare die LEDs are typically small devices, with a bottom conductor that has a foot printed (the surface area for radiating heat) 10-20 thousandths of an inches square. In accordance with this exemplary embodiment, at least the bottom of the bare die LED is surrounded by the much larger area of the phase change material that absorbs the heat and transfers it to conductive lands.

At least one of the substrate and the superstrate can be transmissive to light, and the bare die electronic device comprise a light emitting diode. The connection land can have a surface area in direct thermal contact with the electrically conductive phase change material, where the surface area is significantly larger than the bottom conductor.

At least a portion of the top electrically conductive surface may comprise the electrically conductive phase change material. In this case, the top electrically conductive surface can be formed, for example, by printing the electrically conductive phase change material as at least a portion of the top electrically conductive surface. For example, the electrically conductive phase change material may be a very low temperature solder or alloy. Even though a portion of the electrically conductive phase change material may go into a molten state the adhesive maintains the electrical connection between the bottom conductor and the conductive surface (e.g., printed circuit etched lead) through the electrically conductive phase change material.

The electrically conductive phase change material can have a melting point that is less than a maximum operating temperature of an operating temperature range of the bare die electronic device. The melting point of the electrically conductive phase change material can be chosen so that if the bare die LED is pulse driven with a pulse duration and pulse wattage, and during the pulse duration the pulse wattage causes the temperature of the bottom conductor to reach the melting point of the phase change material, at least a portion of the phase change material melts to remove heat from the bare die LED by transferring heat energy from the bottom conductor through the phase change material to the top electrically conductive surface.

Figure 13:
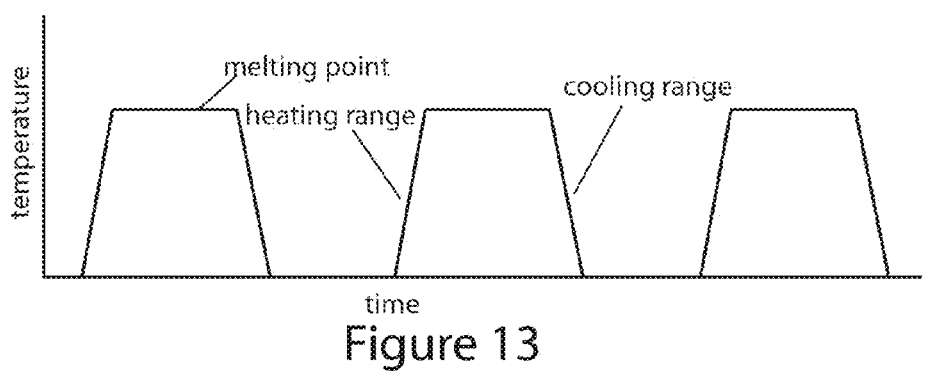
FIG. 13 graphically represents phases of a phase change material protecting a pulse driven semiconductor device.

The phase change material can have a melting point effective to cause at least a portion of the phase change material to undergo a freeze/thaw cycle during the pulse duration. FIG. 13 graphically represents phases of a phase change material protecting a pulse driven semiconductor device. For example, the bare die LED can be driven with pulse width modulation where the pulse duration and pulse wattage produce a change in light output of the bare die LED during the pulse duration that is imperceivable to the human eye so that the bare die LED appears to be steady on while the bare die LED is pulse driven. In accordance with the inventive apparatus, the heat of fusion in the freeze/thaw cycles of a Phase Change Material reduces the peak junction temperature experienced by the bare die LED by absorbing the heat. Ideally, during the pulse cycle, enough heat is removed through heat transfer, for example, to the ambient environment, to refreeze the phase change material. Also, the phase change material prevents the temperature of the bare die from falling rapidly, which isothermalizes the bare die over the duty cycle, maintaining a more constant temperature to increase the reliability of the apparatus.

Figure 6:
FIG. 6 is a cross sectional view showing a printed circuit board construction including an electrically conductive phase change material diffused into a heat absorbing composite material.

FIG. 6 is a cross sectional view showing a printed circuit board construction including an electrically conductive phase change material diffused into a heat absorbing composite material. To further maintain more constant temperatures, at least one of the top substrate and the bottom substrate may comprise a heat absorbing composite material including a binder having heat absorbing particulate. The heat absorbing particulate can include at least one of a powdered stone, powdered metal, insulated coated powdered metal, moisture absorbing material, a phase change material and powdered polymer. The binder has strength improving fibers incorporated within the adhesive bulk. The binder can comprise, for example, a two part epoxy having finely divided soapstone heat absorbing particulate.

The electrically conductive phase change material is diffused into the heat absorbing composite material. The heat absorbing composite material having the diffused electrically conductive phase change material can be formed by printing or otherwise disposing the electrically conductive phase change material on the surface of the binder while uncured. The electrically conductive phase change material is diffused into the heat absorbing composite material by applying pressure, and alternatively or additionally, the electrically conductive phase change material can be diffused into the heat absorbing composite material using a suitable solvent system.

Figure 7:
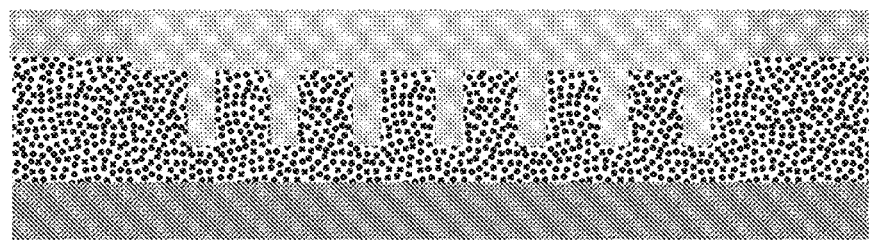
FIG. 7 is a cross sectional view showing grooves formed in a composite material heat absorbing substrate and fins of the electrically conductive phase change material formed into the grooves.

FIG. 7 is a cross sectional view showing grooves formed in a composite material heat absorbing substrate and fins of the electrically conductive phase change material formed into the grooves. The top conductive surface can be formed subsequent to the curing of the substrate by printing conductive leads in electrical communication with the electrically conductive phase change material. Also, the electrically conductive phase change material may have fins extending into in the composite material heat absorbing substrate. The fins increase the surface area for heat transfer from the bare die LED through the electrically conductive phase change material and into the heat absorbing composite material. Grooves can be formed in the composite material heat absorbing substrate and the fins formed by printing, doctor blading or otherwise disposing the electrically conductive phase change material into the grooves. A heat radiating metallic film formed on an outside surface of the composite material heat absorbing substrate. The heat radiating metallic film helps to transform the heat from the heat absorbing composite material to further assist in removing heat from the bare die LED.

Figure 8A:
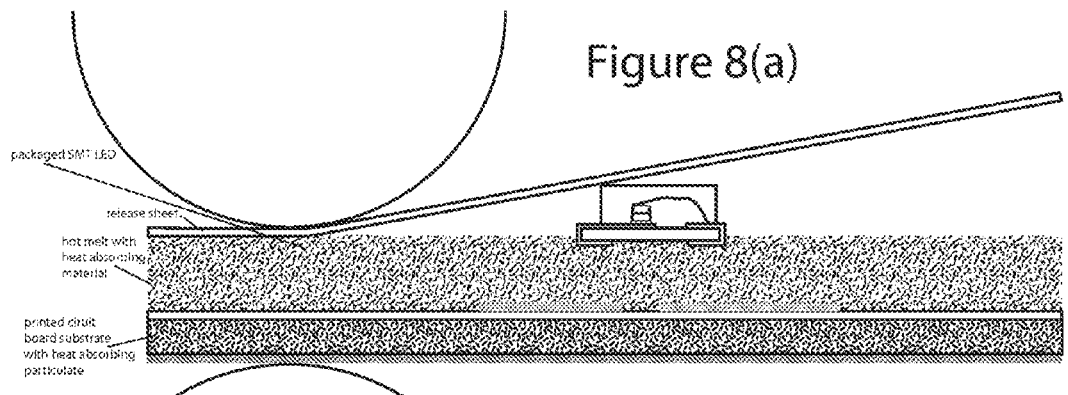
FIG. 8(a) illustrates an inventive manufacturing process where a packaged SMT LED is connected to a printed circuit board without solder and fully embedded in a hot melt adhesive with heat absorbing material and showing the release sheet used during a lamination process for driving the SMT LED through the hot melt adhesive.

FIG. 8(a) illustrates an inventive manufacturing process where a packaged SMT LED is connected to a printed circuit board without solder and fully embedded in a hot melt adhesive with heat absorbing material and showing the release sheet used during a lamination process for driving the SMT LED through the hot melt adhesive. The SMT LED is placed onto or partially embedded into the adhesive. The adhesive can be pre-loaded on a substrate that includes conductive lands for making electrical contact with the two conductors on the bottom of the SMT LED. In some embodiments, the SMT LED may be pre-soldered onto the conductive lands, and the circuit board may be a flexible circuit board enabling a roll-to-roll or otherwise continuous manufacturing process. The two conductors on the bottom of the SMT LED can be driven through the adhesive (with the adhesive in a flowing or plastic state). The adhesive would rather be with itself than wet the surface of the two bottom conductor. The adhesive does not adequately wet the two bottom conductors to prevent (i.e., become an electrical insulator) blocking the flow of electrons through the p/n junction. Thus, the packaged SMT LED can be securely fixed in electrical contact with the conductive lands of the printed circuit with or without solder.

Figure 8B:
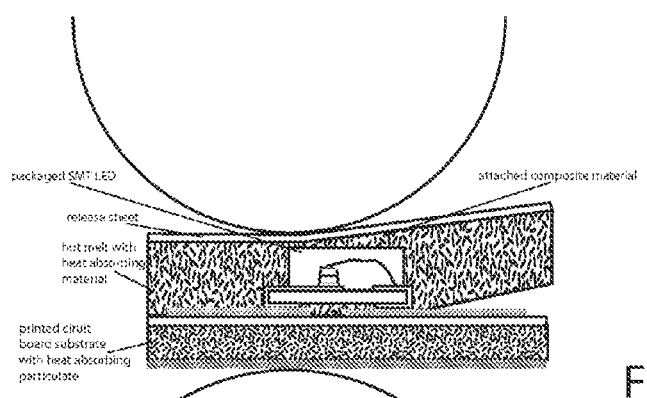
FIG. 8(b) illustrates the inventive manufacturing process where the packaged SMT LED connected to a printed circuit board without solder and fully embedded in the hot melt adhesive with heat absorbing material and showing the release sheet used during a lamination process for driving the SMT LED through the hot melt adhesive.

FIG. 8(b) illustrates the inventive manufacturing process where the packaged SMT LED is connected to a printed circuit board without solder and fully embedded in the hot melt adhesive with heat absorbing material and showing the release sheet used during a lamination process for driving the SMT LED through the hot melt adhesive. Depending on the type of adhesive used to bind the superstrate to the substrate, the SMT LED can be in direct face to face contact without solder, or, for example, if a non-conductive phase change material is used, it may be more advantageous to solder mount the SMT LEDs to the connection lands. Lamination rollers are indicated by half circles, these rollers may be heated to melt or activate the adhesive or phase change material to allow the pressure between the rollers to drive the packaged SMT LED through the adhesive and become embedded in a water proof, flexible, secure, protective barrier.

Figure 9A:
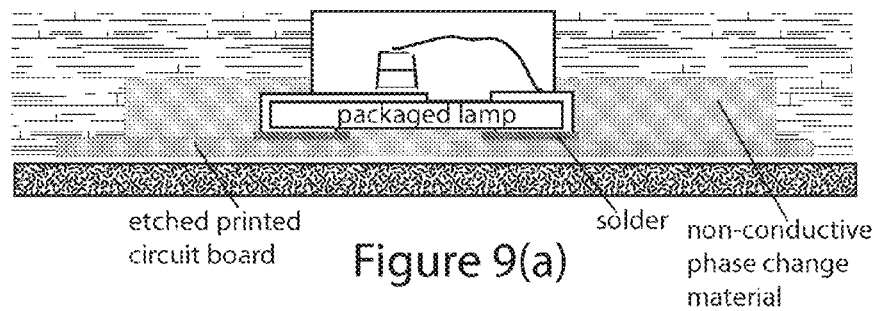
FIG. 9(a) illustrates a non-limiting, exemplary embodiment showing the packaged SMT LED connected to a printed circuit board with solder.
Figure 9B:
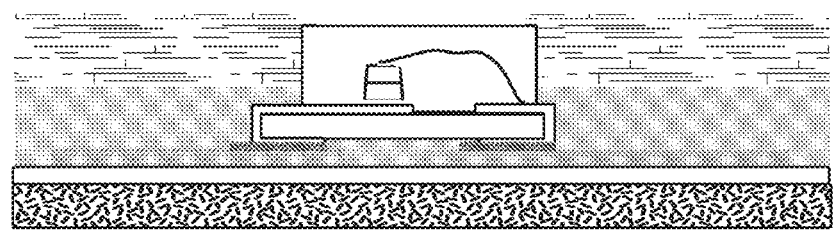
FIG. 9(b) illustrates a non-limiting, exemplary embodiment showing the packaged SMT LED connected to a printed circuit board with solder.
Figure 9C:
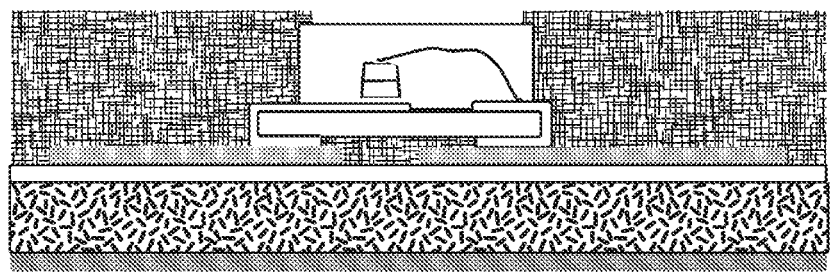
FIG. 9(c) illustrates a non-limiting, exemplary embodiment showing the packaged SMT LED connected to a printed circuit board with solder.
Figure 9D:
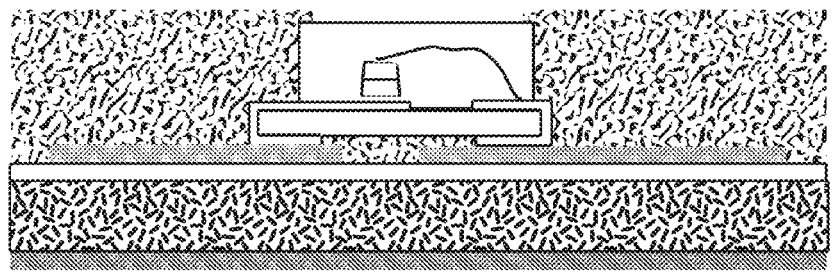
FIG. 9(d) illustrates a non-limiting, exemplary embodiment showing the packaged SMT LED connected to a printed circuit board with solder. In this case, the packaged lamp is driven into direct face to face electrical contact to a printed or etched circuit connection lands and fully embedded in a composite material including a binder and a phase change material.
Figure 9E:
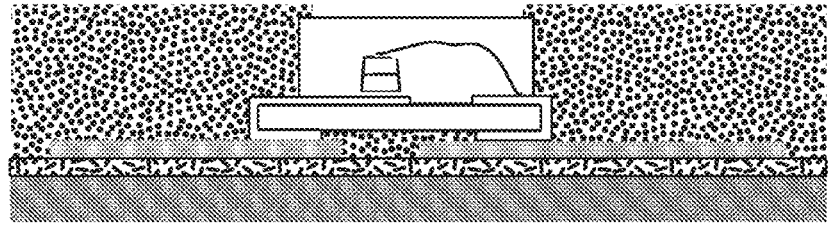
FIG. 9(e) illustrates a non-limiting, exemplary embodiment showing the packaged SMT LED connected to a printed circuit board with solder.
Figure 10A:
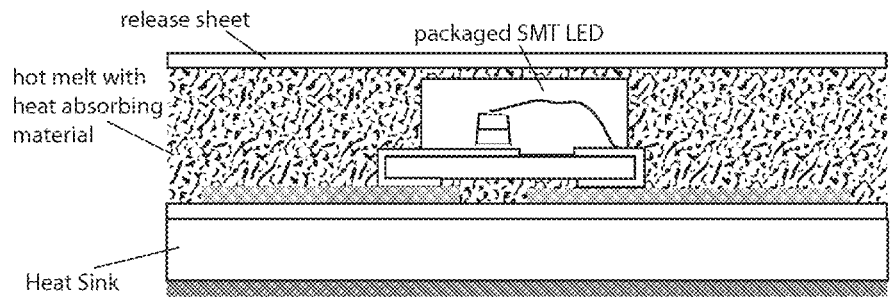
FIG. 10(a) shows a release sheet used in exposing a light emitting lens while leaving the rest of a packaged SMT LED embedded in a thermally active adhesive and in direct face-to-face electrical contact with the top conductor of the thermally active substrate.
Figure 10B:
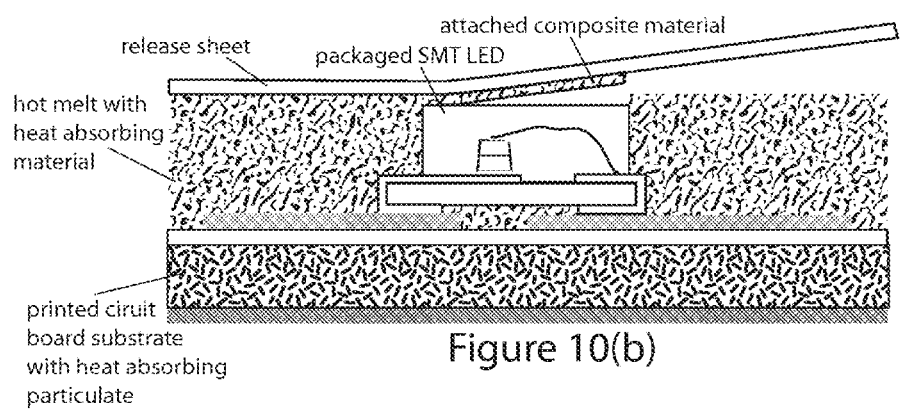
FIG. 10(b) illustrates the pealing of a release sheet used during the process of embedding the packaged SMT LED in a thermally active adhesive and in direct face-to-face electrical contact with the top conductor of the thermally active substrate.

FIG. 9(a) illustrates a non-limiting, exemplary embodiment showing the packaged SMT LED connected to a printed circuit board with solder. In this case, the packaged lamp is pre soldered to a printed or etched circuit connection lands with a non-conductive phase change material surrounding the base of the soldered packaged lamp and embedded in the phase change material and the hot melt adhesive;

FIG. 9(b) illustrates a non-limiting, exemplary embodiment showing the packaged SMT LED connected to a printed circuit board with solder. In this case, the packaged lamp is pre soldered to a printed or etched circuit connection lands within a layer of non-conductive phase change material and a layer of the hot melt adhesive with heat absorbing material surrounding the base of the soldered packaged lamp to fully embed the packaged lamp in the heat absorbing and phase change layers;

FIG. 9(c) illustrates a non-limiting, exemplary embodiment showing the packaged SMT LED connected to a printed circuit board with solder. In this case, the packaged lamp is driven into direct face to face electrical contact with a printed or etched circuit connection land and fully embedded in a hardenable adhesive;

FIG. 9(d) illustrates a non-limiting, exemplary embodiment showing the packaged SMT LED connected to a printed circuit board with solder. In this case, the packaged lamp is driven into direct face to face electrical contact to a printed or etched circuit connection lands and fully embedded in a composite material including a binder and a phase change material;

FIG. 9(e) illustrates a non-limiting, exemplary embodiment showing the packaged SMT LED connected to a printed circuit board with solder. In this case, the packaged lamp is fully embedded in a composite material including a binder and a heat active material, and retained in direct electrical connection on a thermally active printed circuit hoard/heat sink without solder;

The protective barrier of the adhesive provides a water proof, dust proof thermally advantageous protection of the package SMT LED and also secures the electrical connection of the two bottom conductors (or multiple conductors). However, the optical properties of the protective barrier are not likely to be a better of a light transmission match than the lens material or optical stack that makes up the packaged lamp from the emissive LED surface to the top of the lens open to the outside. Accordingly, FIG. 10(a) shows a release sheet that is removed exposing a light emitting lens while leaving the rest of a packaged SMT LED embedded in a thermally active adhesive and in direct face-to-face electrical contact with the top conductor of the thermally active substrate. FIG. 10(b) illustrates the pealing of a release sheet used during the process of embedding the packaged SMT LED in a thermally active adhesive and in direct face-to-face electrical contact with the top conductor of the thermally active substrate. Over time, the relatively intense light from the LED emitter or ambient light or oxidation (or other degrading process) causes many materials to yellow. This has been a problem in the industry and the lens materials and the rest of the optical stack of the LED are usually made of materials selected to maximize the light output and to prevent or mitigate against yellow or clouding over time. In accordance with this aspect of the invention, the best parts of the packaged lamps optical make-up is preserved and the lens surface is exposed while leaving the vulnerable SMT LED nearly fully embedded in a barrier and/or thermally advantageous film binding film (the adhesive, adhesive/phase change material layers, adhesive with phase change domains, adhesive with phase change wells, etc., as shown and described herein and also as might otherwise logically be used to achieve the intended purpose of tending to maximize light output, lower cost, ease manufacturing, reduce manufacturing capital equipment, reduce failure modes and provide device protection).

Figure 10C:
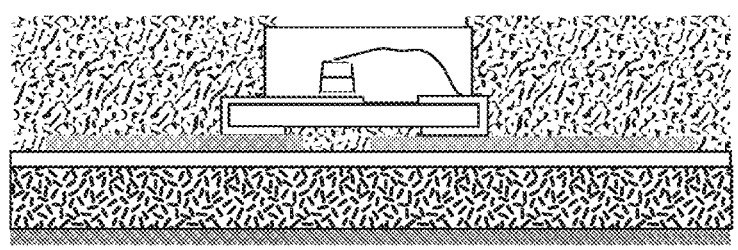
FIG. 10(c) illustrates the exposed light emitting lens with the rest of the packaged SMT LED embedded in a thermally active adhesive and in direct face-to-face electrical contact with the top conductor of the thermally active substrate.
Figure 10D:
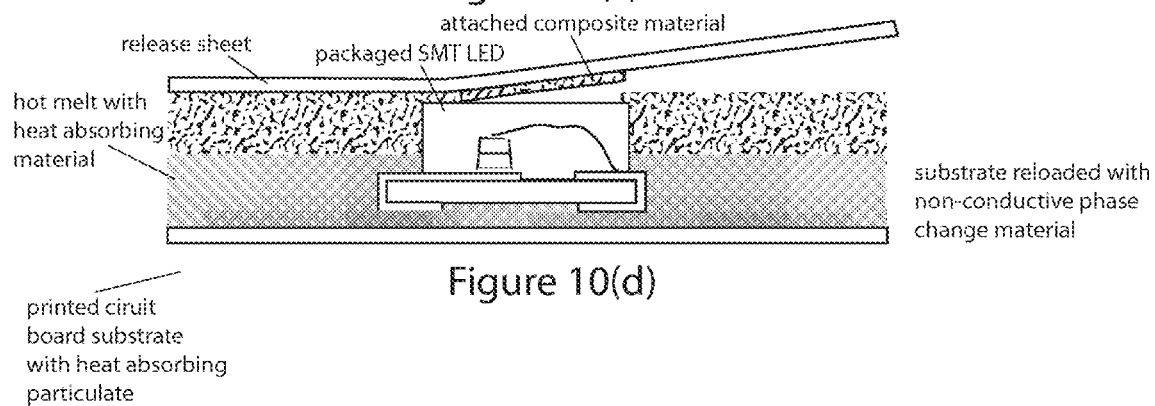
FIG. 10(d) illustrates the pealing of a release sheet exposing the light emitting lens while leaving the rest of a packaged SMT LED embedded in a layer of phase change material and in the thermally active adhesive and in direct face-to-face electrical contact with the top conductor of the thermally active substrate.
Figure 11A:
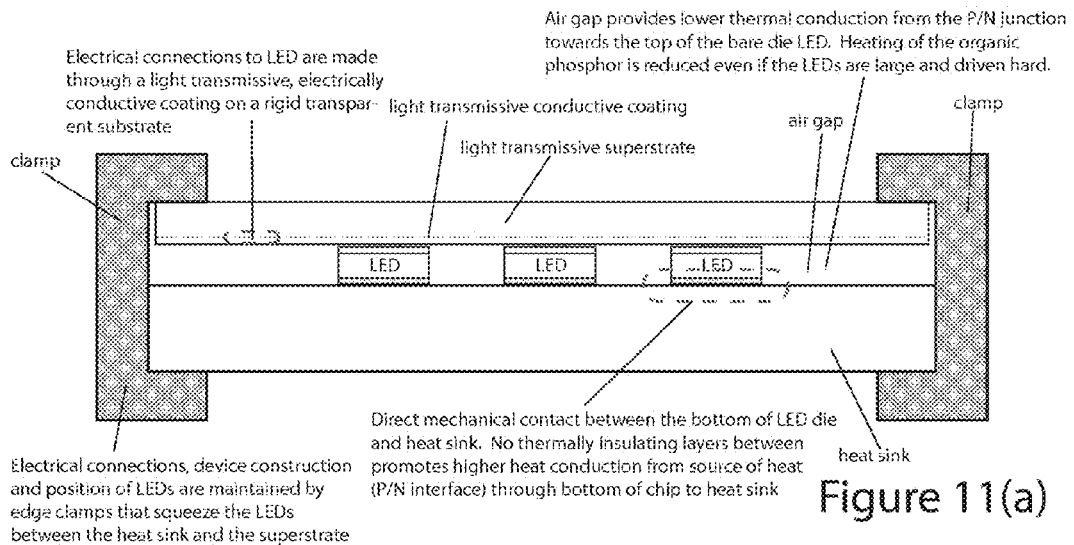
FIG. 11(a) is a cross sectional view of another non-limiting exemplary embodiment showing bare die LEDs retained between planar, rigid conductive surfaces via clamps.

FIG. 10(c) illustrates the exposed light emitting lens with the rest of the packaged SMT LED embedded in a thermally active adhesive and in direct face-to-face electrical contact with the top conductor of the thermally active substrate. FIG. 10(d) illustrates the pealing of a release sheet exposing the light emitting lens while leaving the rest of a packaged SMT LED embedded in a layer of phase change material and in the thermally active adhesive and in direct face-to-face electrical contact with the top conductor of the thermally active substrate;

FIG. 11(a) is a cross sectional view of another non-limiting exemplary embodiment showing bare die LEDs retained between planar, rigid conductive surfaces via clamps. In accordance with this exemplary embodiment, electrical connections, device construction and position of LEDs are maintained by edge clamps that squeeze the bare die LEDs between a heat sink and the superstrate. The electrical connections to the bare die LED are made through a light transmissive, electrically conductive coating (e.g., ITO) on a rigid transparent substrate (e.g., glass). An air gap provides lower thermal conduction from the P/N junction towards the top of the bare die LED. Excessive heating of an organic phosphor is reduced even if the bare die LEDs are large and driven hard with a direct mechanical contact between the bottom of LED die and heat sink. The lack of thermally insulating layers between promotes higher heat conduction from source of heat (P/N interface) through bottom of chip to heat sink. In this embodiment, an adhesive between the substrate (e.g., heat sink) and the superstrate (e.g., glass) is optional. The rigid materials and the clamp structures keep the electrical connections intact.

In accordance with this exemplary embodiment, a rigid substrate has a bottom electrically conductive surface disposed on a top of the substrate. A superstrate having a top electrically conductive surface disposed on a bottom of the superstrate. A bare die electronic device having a top conductor and a bottom conductor, at least one of the top conductor in direct electrical communication with the bottom electrically conductive surface and the bottom conductor in direct electrical communication with the top conductive surface, wherein during operation the bare die electronic device generates heat having an operating temperature range. A clamp urges the substrate towards the superstrate so that the bare die electronic device is retained in electrical communication with at least one of the bottom electrically conductive surface and the top electrically conductive surface. The clamp has an urging force effective to prevent a separation of the electrical communication of the bare die electronic device with said at least one of the bottom electrically conductive surface and the top electrically conductive surface.

Figure 11B:
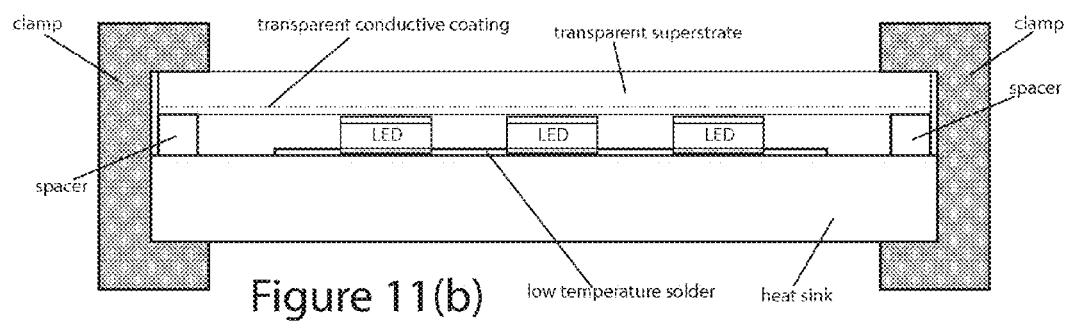
FIG. 11(b) is a cross sectional view showing bare die LEDs retained between planar, rigid conductive surfaces via clamps fixed to a heat sink via a phase change material comprising a low temperature solder.

FIG. 11(b) is a cross sectional view showing bare die LEDs retained between planar, rigid conductive surfaces via clamps fixed to a heat sink via a phase change material comprising a low temperature solder. The bottom conductor can be in electrical contact with the top conductive surface through an electrically conductive phase change material. If the bare die electronic device is driven with a wattage causing a temperature of the bottom conductor to reach a melting point of the phase change material at least a portion of the phase change material between the bottom conductor and the top electrically conductive surface melts to remove heat from the bare die LED by transferring heat energy from the bottom conductor through the phase change material to the top electrically conductive surface.

Figure 11C:
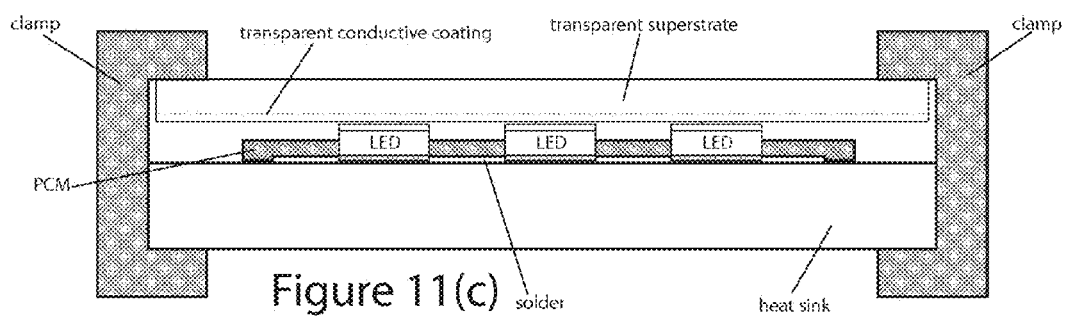
FIG. 11(c) is a cross sectional view showing bare die LEDs retained between planar, rigid conductive surfaces via clamps and partially embedded in a non-conductive phase change material with an air channel for removing heat from the LEDs via forced air.

FIG. 11(c) is a cross sectional view showing bare die LEDs retained between planar, rigid conductive surfaces via clamps and partially embedded in a non-conductive phase change material with an air channel for removing heat from the LEDs via forced air. A non-conductive heat absorbing layer may be disposed in direct thermal contact with at least one surface of the bare die electronic device to absorb at least a portion of the heat generated as the bare die electronic device reaches its operating temperature to lessen thermal shocks to individual component structures of the bare die device, mechanical connections between the individual component structures of the bare die device, individual component structures of the apparatus, and mechanical connections between the individual component structures of the apparatus. The non-conductive heat absorbing layer comprises a phase change material. As an example, the phase change material may comprise a wax. The heat absorbing material may comprise a binder and a heat absorbing particulate. The heat absorbing particulate can include at least one of a powdered stone, powdered metal, insulated coated powdered metal, moisture absorbing material, a particulate of a phase change material, and powdered polymer. The binder can encapsulate small domains of the phase change particulate, and/or have strength improving fibers incorporated within the adhesive bulk. As an example, the binder may comprise a two part epoxy having finely divided soapstone heat absorbing particulate.

The rigid substrate may comprise a heat sink in addition or alternately, the rigid substrate may comprise a composite heat absorbing material. The rigid superstrate may comprise at least one of a transparent glass or plastic, and the top electrically conductive surface may comprise at least one of indium tin oxide and a printed translucent electrically conductive material. The printed translucent electrically conductive material includes a phosphor.

Figure 11D:
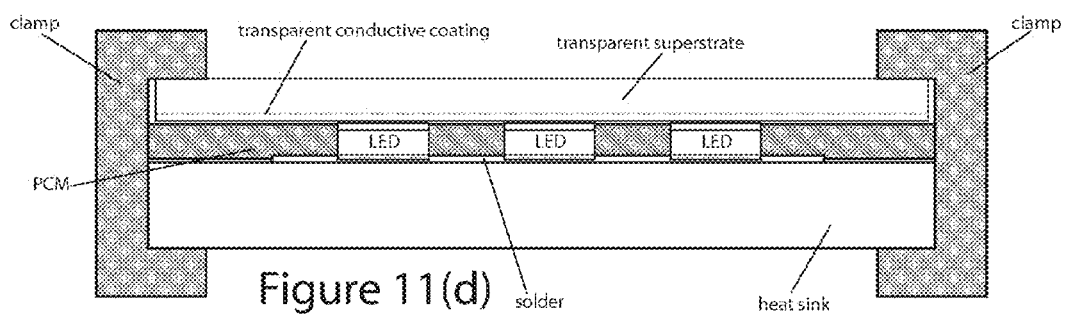
FIG. 11(d) is a cross sectional view showing bare die LEDs retained between planar, rigid conductive surfaces via clamps and fully embedded in a non-conductive phase change material.

FIG. 11(d) is a cross sectional view showing bare die LEDs retained between planar, rigid conductive surfaces via clamps and fully embedded in a non-conductive phase change material. In accordance with this embodiment, the phase change material may be disposed completely surrounding the sides of the bare die electronic device, helping to reach a maximum thermal contact/thermal transfer away from the bare die electronic device.

FIG. 2(a) is a cross sectional view showing a printed circuit board having packaged semiconductor electronics fully embedded within a barrier of heat absorbing composite material. In accordance with this aspect of the invention, the heat absorbing composite material can be injected or poured in an uncured flowing stage and have a viscosity effective to enable the uncured heat absorbing composite material to flow around the packaged semiconductor electronic devices to create an effective barrier against water, dust and other foreign materials.

The barrier and thermal properties, as well as the mechanical properties (rigidity, flexibility, etc.) can be selected and layered as necessary to optimize the mitigation of the conventional protections (e.g., conformal coatings) applied to the circuit boards use, for example, in laptop computers, mobile communication devices, lighting devices and other heat generating electronics uses. The protective materials (adhesives, phase change materials, barrier materials, etc.), are selected in accordance with the exemplary, non-limiting embodiments to mitigate against failures caused by, for example, unequal thermal expansion of the components making up the discrete packaged devices (e.g, wire bonds within the packaged device), and/or making electrical and/or mechanical connections among the components (solder connections), and/or keeping composite materials together with no relative movement among layers or parts (etched printed circuit board). The packaged electronic devices that generate heat have that heat absorbed radiated away to prevent rapid changes in temperature and reduce the unequal thermal expansion of the various materials that make up the components that are manufactured into the working devices (e.g., an LED Lightsheet).

Figure 12A:
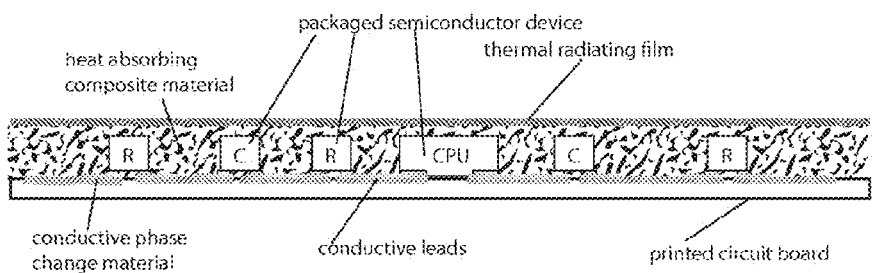
FIG. 12(a) is a cross sectional view showing a printed circuit board having packaged semiconductor electronics fully embedded within a barrier of heat absorbing composite material.
Figure 12B:
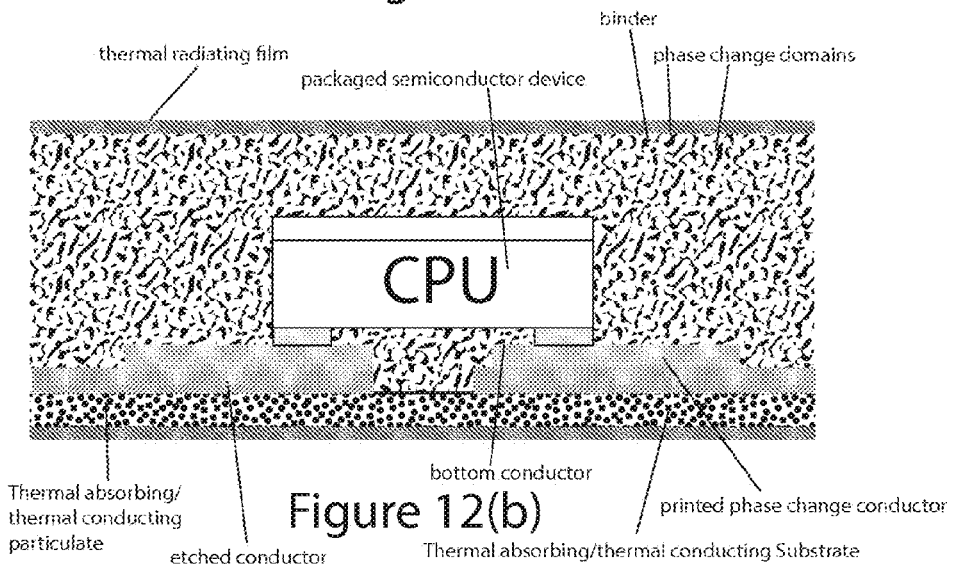
FIG. 12(b) is a cross sectional view showing a packaged semiconductor electronic device fully embedded within a barrier of heat absorbing composite material and electrically connected to a printed circuit board through conductive phase change material, where the printed circuit board substrate is a heat absorbing composite material.

FIG. 12(b) is a cross sectional view showing a packaged semiconductor electronic device fully embedded within a barrier of heat absorbing composite material and electrically connected to a printed circuit board through conductive phase change material, where the printed circuit board substrate is a heat absorbing composite material. The materials may be selected to provide direct thermal transfer away from the heat sources (CPUs in the case of packaged electronics on a circuit board or p/n junctions in the case of the bare die aspects described herein). The thermal transfer may be from heat absorbers (such as powdered soapstone), phase change materials (such as wax or low temperature solder) or heat conductors such as carbon nanotubes, forming for example, domains within a binder and/or adhesive.

Figure 12C:
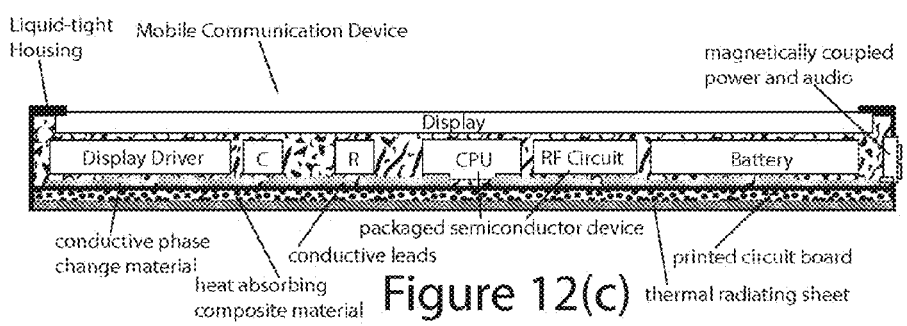
FIG. 12(c) is a cross sectional view of a waterproof, shock resistant mobile communication device with internal components fully embedded within a barrier of heat absorbing composite material.

FIG. 12(c) is a cross sectional view of a waterproof, shock resistant mobile communication device with internal components fully embedded within a barrier of heat absorbing composite material. As an example, a mobile communication device, such as a smart phone, tablet, or laptop computer is prone to jarring shocks, such as from dropping or transportation. In accordance with an aspect of the invention, these parts are embedded within a heat absorbing, shock absorbing protective barrier that prevents movement due to shock (thermal or mechanical), while at the same time, making the device totally waterproof. Power and input/outputs can be achieved through, for example, inductive elements or magnetically coupled (for securing cables, for example) solid state electrical communicators (e.g., insulated edge connectors). The barrier material with the heat active components can be injected, poured, sprayed, molded or otherwise formed around the electronic elements being protected.

For example, as shown in FIG. 12(c), all of the electronics, batteries, RF elements, touch display and, memory and power components are housed in a liquid tight housing. All of the electronic components are either solid state or, for example, in the case of the a disc memory, hermetically sealed. The heat absorbing composite material can be injected in fluid form into the housing and allowed to cure. To remove heat from the heat generating components (e.g., the CPU) there is a preferred heat transfer path from the CPU through to a thermal radiating sheet (for example, aluminum or titanium plate). RF transmissive areas may also be included, or patch type antennas can be applied on the side of the thermal radiating sheet opposite the CPU. Once the binder in the heat absorbing composite material has hardened, all of the electronic components are protected from water, shock, dust, and thermal damage. There is no air gap and considerably less flexure of the components embedded in the barrier composite material and even a glass display is less likely to crack when dropped or due to freezing conditions. The mechanical properties of the materials can be chosen, for example, so that composite material restrains thermal expansion and prevents rapid changes without exceeding desired thresholds of strain to the components caused by the composite material restraint. As an example, the composite material may include a polyurethane with a suitable durometer and thermal additives, or an acrylic with a desired rigidity, or as a more specific example, a two part epoxy binder with finely divided soap stone powder. The soap stone powder is a rapid absorber of thermal energy and releases the thermal energy gradually creating a kind of thermal spring to keep the electronic, mechanical and optical components from harmful thermal shocks and rapid thermal expansions.

The exemplary embodiments describe various combinations of materials and processes. For example, the phase change material may be applied as a film sprayed around the electronic devices (like a conformal coating) and then locked in place with hardened binder and heat absorbing/conducting particulate and/or domains.

The improved Lightsheet is particularly suited to applications in the transportation industry. The improved Lightsheet structures and manufacturing processes disclosed herein provide features and benefits that go well beyond what has conventionally been expected in LED lighting for use, for example, in transportation applications. The improved Lightsheet offers an advanced lighting technology that has inherent flexibility and consistent, high-quality brightness, with the strength and material integrity to resist extreme conditions and provide a fill range of benefits that have either been unavailable or too impractical to engineer into, for example, conventional transportation designs. The improved Lightsheet provides smooth, homogeneous lighting effects that can sharp lines or complex patterns using, for example, special optics, that add a new level of performance as compared to traditional LED lighting designs. The improved Lightsheet offers cutting-edge thin-film design, and can conform to almost any shape or contour without sacrificing quality and performance. The improved Lightsheet is a durable, flexible, light-weight, low-profile LED lighting, specifically adaptable for OEM and aftermarket applications in the transportation industry, and many other industries where lighting form factors, cost, and efficacy are important design considerations.

As compared with conventional LED lighting solutions, the improved Lightsheet can be about 2% of the weight while maintaining one hundred percent of the performance characteristics needed for high demand transportation applications. The improved Lightsheet can be considered an ultra-light weight product with a flexible design that eliminates a significant portion of the installation costs that are often associated with drilling, brackets and fasteners. The improved Lightsheet can be considered an eco-friendly alternative with features such as a highly flexible For example, a Marker Lamp constructed using the improved Lightsheet embodiment described herein may require just 2% of the weight of a standard clearance marker lamp.

Figure 12D:
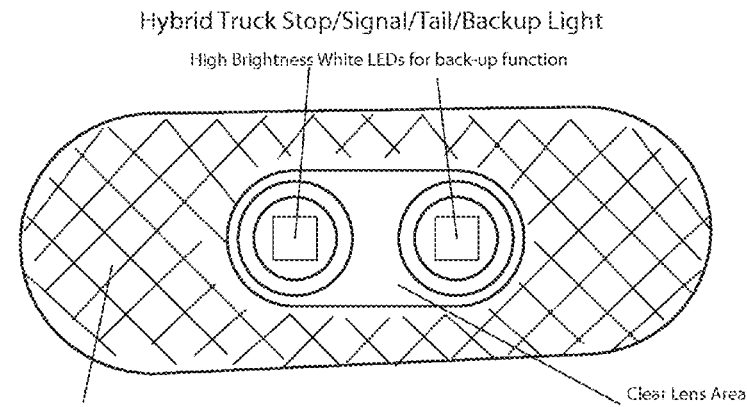
FIG. 12(d) is an illustration of a stop/signal/tail/backup hybrid bare die LED/packaged LED in accordance with an embodiment of the improved Lightsheet.
Figure 12E:
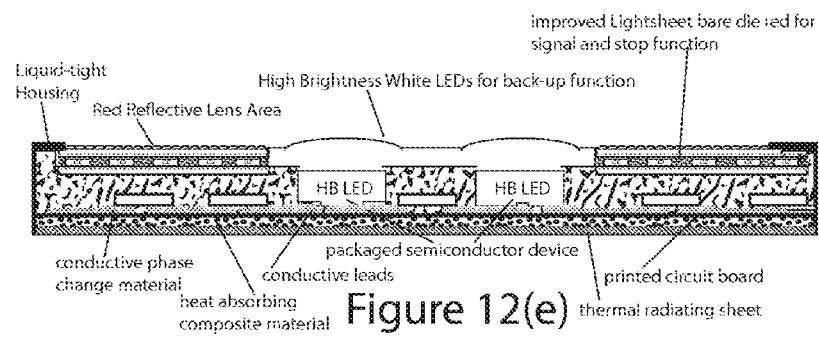
FIG. 12(e) is a cross sectional view of a waterproof, shock resistant stop/signal/tail/backup hybrid bare die LED/packaged LED with internal components fully embedded within a barrier of heat absorbing composite material.

FIG. 12(d) is an illustration of a stop/signal/tail/backup hybrid bare die LED/packaged LED in accordance with an embodiment of the in Lightsheet. FIG. 12(e) is a cross sectional view of a waterproof, shock resistant stop/signal/tail/backup hybrid bare die LED/packaged LED with internal components fully embedded within a barrier of heat absorbing composite material. The hybrid structure combines the advantages of the bare die LED improved Lightsheet, as described herein in the exemplary embodiments, along with the packaged LED in a heat absorbing barrier material to create a stop/signal/tail/backup hybrid bare die LED/packaged LED lamp that is a significant improvement over similar commercially available products.

The improved Lightsheet has a flexible lamination construction that also helps protect the bare die LEDs and seal out the environment. The improved Lightsheet is strong enough to withstand multiple hammer blows and a variety of rigorous testing environments. The result is a robust and reliable solution that the ability to create custom light patterns in a variety of colors, shapes and designs.

As exemplary applications in the transportation industry, the improved Lightsheet can be used for door pockets consoles seat areas, cup holders, and the like. The potential uses for the improved Lightsheet in transportation vehicle applications are virtually unlimited, with the flexibility and ultra-thin benefits, combined with the ability to produce a consistent pattern of light in a variety of vibrant colors making the improved Lightsheet a particularly effective solution for cabin and accent lighting designs including, but not limited to, ambient lighting, decorative lighting, display lighting, and lighting in or on glass.

The improved Lightsheet can be constructed and driven to provide multi-color LED lighting effects to automotive, airplane, boat or architectural interiors. The improved Lightsheet can be constructed as programmable LED strips that allow for dynamic color variations with red, blue and green lights emanating from a single strip. Properly driven, users can select, for example, up to 30 different shades per additive primary color, for a total of 150 different selectable colors, plus seven dimming levels. For example, a controller can include programmable channels to store color selections or use the auto color cycling feature to achieve desired decorative lighting effects.

The improved Lightsheet construction is an effective choice for lighting applications that are subject to testing and certification to federal highway safety standards as well as aviation, marine or military standards. The improved Lightsheet construction can be designed also comply with Lighting Identification Codes P2 and P3

Some of the vehicle applications for the improved Lightsheet include turn signal lighting, signal lighting markers, CHMSL (Center High-Mounted Stop Lamps, License lamps, IR Marker and egress lighting. The improved Lightsheet can be configured as LED lighting strips that produce a consistent pattern of light in a variety of colors to light up vehicle interiors or dramatically highlight the outside of an automobile, motorcycle, boat, plane or other applications. The improved Lightsheet can be placed around objects, on curves and in tight spots, and configured as waterproof strips that allow designers to add unique lighting effects inside or out for decorative lighting, ornamental applications ad to highlight vehicle shapes or features.

The improved Lightsheet can be formed as an ultra-thin, flexible strip of LED light that can wrap around corners, over contours and conform to complicated shapes, making an effective source of lights for intricate and complex surfaces that incorporate a variety of shapes and critical functions. Transportation industry applications, such as dashboards and instrument panels, decorative lighting trim, and instrument panel lighting are particularly suited for the embodiments of the improved Lightsheet described herein.

Other improved Lightsheet applications in the transportation industry include watercraft exterior or any other waterproof exterior application. The improved Lightsheet can be configured as waterproof LED light strips that include UV and environmental protective coatings for maximum protection from the elements to ensure reliable, long-term performance in the harshest exterior applications, including exterior trim, decorative lighting, and to highlight a watercraft shapes or features. The improved Lightsheet can be configured as a homogenous, uniform strip of light making an ultra-thin, flexible LED light source that wraps around corners, over contours and into complicated shapes to form a continuous strand of light.

FIG. 13 graphically represents phases of a phase change material protecting a pulse driven semiconductor device. The phase changes during the freeze/thaw cycle of the phase change material follows the pulse power applied to the bare die LED being thermally protected. As the bare die LED heats up, the solid phase change material heats up to its melting point. At the melting point, the heat of fusion absorbs the peak heat generated primarily at the p/n junction of the LED, and the pulse power off period allows the bare die LED and the phase change material to cool and the phase change material to re-solidify (freeze), ready to absorb the heat from the bare die LED during the next power on period of the power pulse cycle. The melting point of the electrically conductive phase change material is chosen so that if the bare die LED is pulse driven with a pulse duration and pulse wattage and during the pulse duration the pulse wattage causes the temperature of the bottom conductor to reach the melting point of the phase change material at least a portion of the phase change material melts to remove heat from the bare die LED by transferring heat energy from the bottom conductor through the phase change material to the top electrically conductive surface.

Figure 14A:
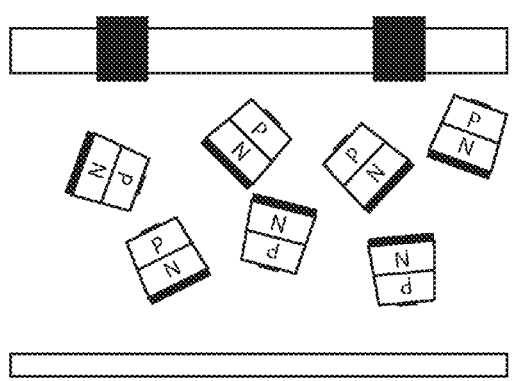
FIG. 14(a) illustrates another non-limiting, exemplary embodiment showing bare die LEDs with a magnetically active material coated on an electrode and randomly dispersed.

FIG. 14(a) illustrates another non-limiting, exemplary embodiment showing bare die LEDs with a magnetically active material coated on an electrode and randomly dispersed. The magnetically active bare die LEDs are dispersed in a fluid or dry atmosphere. For example, the bare die LEDs can be randomly dispersed, within a fluid, hardenable carrier medium. The fluid, hardenable carrier medium allows the bare die LEDs to migrate and orient under the influence of an applied magnetic field. The bare die LEDs have a magnetic material formed, for example, as part of a conductive stack on the bottom conductor. The conductive stack may include a flash of gold, or other suitable plating, that facilitates the forming of a direct face-to-face electrical connection to the conductor. Examples of magnetically active materials include nickel and iron which may be formed, for example, during the conversion of a semiconductor wafer into separate bare die LEDs.

Figure 14B:
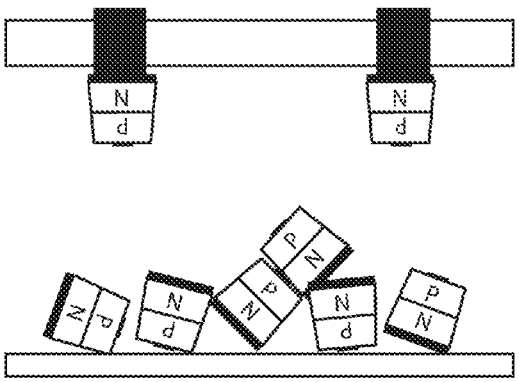
FIG. 14(b) illustrates the bare die LEDs with the magnetically active material showing two LEDs magnetically attracted to migrate to a respective magnetic site.
Figure 15:
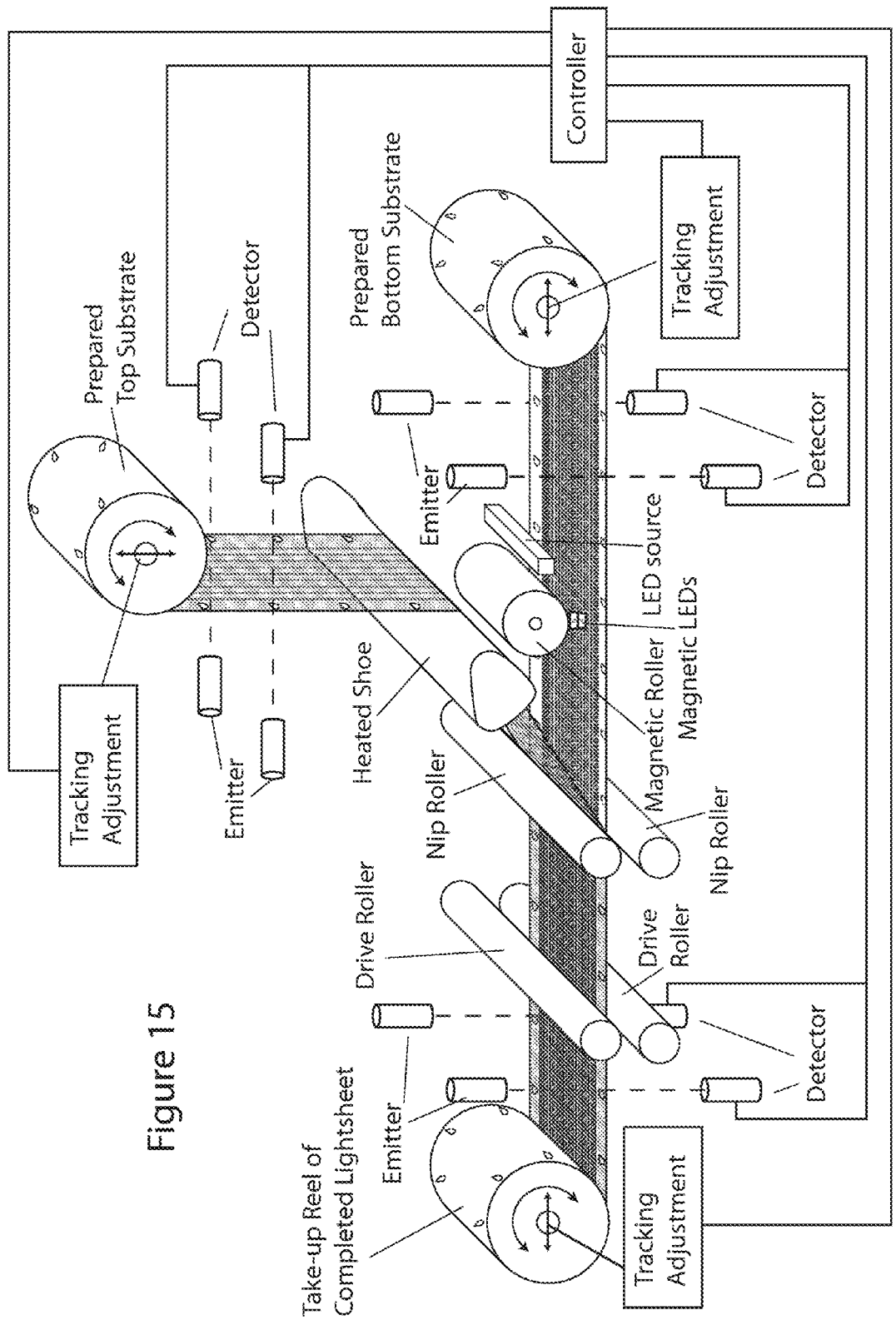
FIG. 15 schematically shows a roll-to-roll manufacturing process for manufacturing, for example, at least one of the exemplary embodiments shown herein.

FIG. 14(b) illustrates the bare die LEDs with the magnetically active material showing two LEDs magnetically attracted to migrate to a respective magnetic site. For example, one magnetically attractive bare die LED is oriented, migrated and positioned at each magnetic site. The magnetic sites may be formed by electromagnets that have a variable magnetic field that can be turned on or off, or by permanent magnets that are brought into proximity with the randomly dispersed bare die so the magnetic field can act through the superstrate. Alternatively, the bare die LEDs can be attracted to a magnetic (or electrostatic) rotating drum and transferred to an adhesive or transfer sheet, for example, in the roll-to-roll manufacturing process shown in FIG. 15.

FIG. 14(c) shows a bare die LED disposed within an unhardened binder with randomly dispersed magnetically attractive electrically conductive filaments. The randomly dispersed magnetically attractive conductive filaments are too sparse and unorganized in orientation to provide a conductive path shorting the bare die LED. Also, a reverse current can be applied to cause any stray conductive pathways to burn-in, where when dispersed and unorganized, the thin, filaments are unable to carry much current without being burned and removed as part of an unwanted conductive pathway.

FIG. 14(d) shows a bare die LED disposed within an hardened binder with electrically aligned magnetically attractive electrically conductive filaments. The organized and uniformly organized conductive filaments are formed by migrating and orienting the randomly dispersed filaments in the vicinity of the, in this case, the top conductor of the bare die LED. The organized conductive filaments provide a preferred conduction path connecting the top conductor of the bare die LED to the conductive surface of the superstrate. The conductive surface can be, a printed flexible conductor, a transparent conductive coating, such as ITO, a conductive grid (with light transmissive spaces between the grid) or other suitable conductive material supported by the superstrate. The bare die LEDs are magnetically attracted to the magnetic attraction sites and oriented in position to become connected LED light sources without the need for solder, conventional semiconductor packaging, wire bonding, etc.

FIG. 14(e) shows a bare die LED with randomly dispersed attractive electrically conductive filaments at the site of the top conductor. Before the aligning field is applied and the hardenable carrier is cured, the hardenable carrier medium surrounding the bare die LEDs is fluid and allows the migration and orientation of the conductive filaments while the bare die LEDs are held in place at the magnetic sites (see, also, FIG. 14(c)).

FIG. 14(f) shows a bare die LED with aligned attractive electrically conductive filaments at the site of the top conductor. Under the influence of an applied magnetic or electric field, the field attractive filaments migrate away from the light emissive top surface of the bare die LED and organize and orient in a highly concentrated pack at the location of the top conductor (see, also FIG. 14(d)). The remaining randomly dispersed conductive filaments are too sparse and unorganized to provide a short that overly degrades the flow of electrons through the p/n junction, and if there are any completed short connections through the randomly dispersed filaments, they are easily cured by applying a reverse voltage that burns away portions of the offending connected filaments effectively disconnecting minor shorts.

FIG. 5 schematically shows a roll-to-roll manufacturing process for manufacturing, for example, at least one of the exemplary embodiments shown herein. In accordance with the exemplary roll-to-roll manufacturing process, the bare die LEDs can be attracted to a magnetic (or electrostatic) rotating drum and transferred to an adhesive or transfer sheet. An LED source provides a hopper located adjacent to a rotating drum, similar to a toner cartridge of a conventional laser printer or copier and the many different conventional mechanisms for selectively directing toner onto a flexible substrate (e.g., paper sheet), can be utilized in accordance with the exemplary roll-to-roll manufacturing process to create a rapid, low cost, light sheet assembly process without the need to individually pick and place the bare die, no wire bonds, no solder, none of the conventional semiconductor packaging and without the need for high cost capital equipment typically associated with creating a printed circuit LED light source.

Figure 16A:
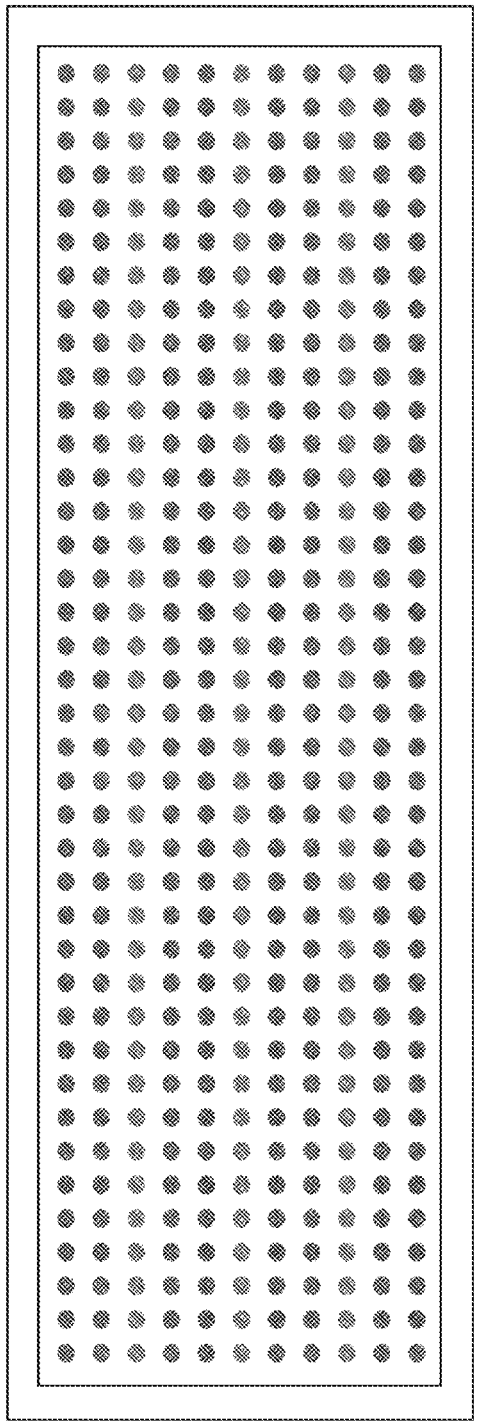
FIG. 16(a) shows an exemplary application of the embodiments shown herein configured as an agricultural grow light with evenly spaced LEDs.

FIG. 16(a) shows an exemplary application of the embodiments shown herein configured as an agricultural grow light with evenly spaced LEDs. Agricultural grow lights are just an example application for the exemplary embodiments described here. In accordance with the exemplary embodiments, these grow light can be mass produced in a low cost, high speed, roll-to-roll manufacturing process.

Figure 16B:
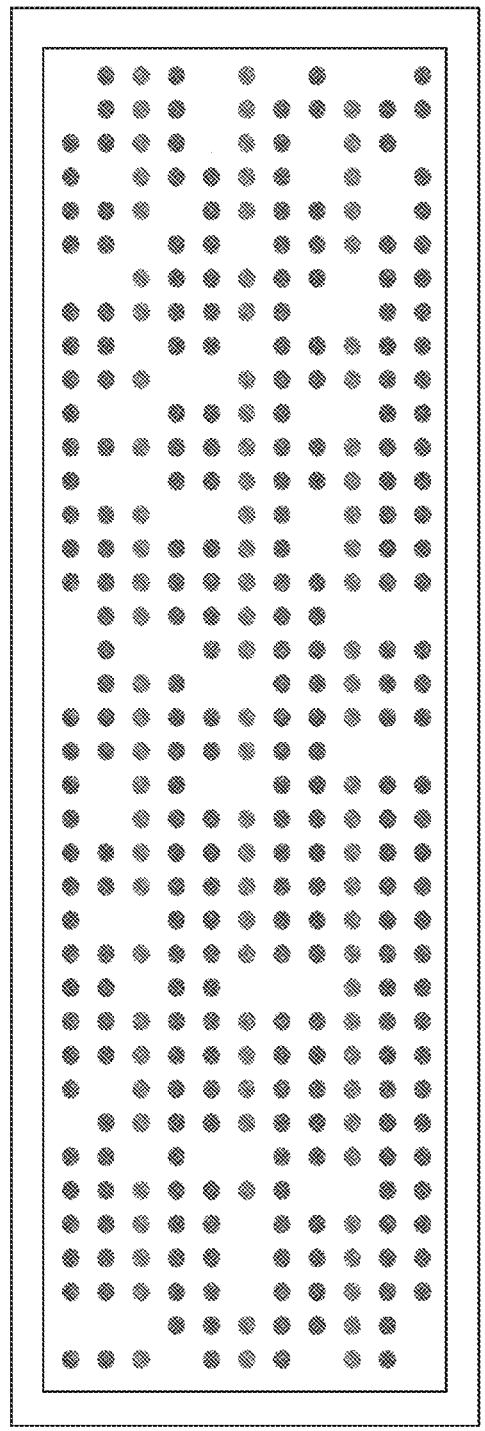
FIG. 16(b) shows another exemplary applications of the embodiments shown herein configured as an agricultural grow light with randomly disposed LEDs.

FIG. 16(b) shows another exemplary applications of the embodiments shown herein configured as an agricultural grow light with randomly disposed LEDs;

The invention claimed is:

1. An apparatus, comprising:
    a substrate having a bottom electrically conductive surface disposed on a top of the substrate;
    a superstrate having a top electrically conductive surface disposed on a bottom of the superstrate;
    a bare die electronic device having a top conductor and a bottom conductor, at least one of the top conductor in direct electrical communication with the bottom electrically conductive surface and the bottom conductor in direct electrical communication with the top conductive surface; and a non-conductive adhesive securing the substrate to the superstrate so that the bare die electronic device is retained in direct electrical communication with at least one of the bottom electrically conductive surface and the top electrically conductive surface, wherein the adhesive comprises a hot melt adhesive having heat absorbing particulate.

2. An apparatus according to claim 1; wherein the bare die electronic device is a light emitting diode for generating light output during the operation, wherein during operation the bare die electronic device generates heat having an operating temperature range; and a non-conductive adhesive securing the substrate to the superstrate so that the bare die electronic device is retained in direct electrical communication with at least one of the bottom electrically conductive surface and the top electrically conductive surface, wherein the non-conductive adhesive has a melting point temperature at least greater than a minimum operating temperature of the operating temperature range so that during an operation of the bare die electronic device the non-conductive adhesive does not melt and flow between at least one of the top conductor and the bottom electrically conductive surface, and the bottom conductor and the top electrically conductive surface thereby preventing a separation or degradation of the direct electrical communication of the bare die electronic device with said at least one of the bottom electrically conductive surface and the top electrically conductive surface and wherein during the operation a minimum light generating temperature is generated when the light emitting diode generates a minimum useful light output and a maximum light generating temperature is generated when the light emitting diode generates a maximum useful light output; and wherein the melting point of the non-conductive adhesive is at least greater than the minimum light generating temperature.

3. An apparatus according to claim 2; wherein the melting point temperature is between the minimum light generating temperature and the maximum light generating temperature.

4. An apparatus according to claim 1; wherein at least one of the substrate and the superstrate are transmissive to light, and the bare die electronic device comprises a light emitting diode.

5. An apparatus according to claim 1; wherein the heat absorbing particulate absorbs the heat generated as the bare die electronic device reaches its operating temperature to lessen thermal shocks to individual component structures of the bare die device, mechanical connections between the individual component structures of the bare die device, individual component structures of the apparatus, and mechanical connections between the individual component structures of the apparatus.

6. An apparatus according to claim 5; wherein the heat absorbing particulate includes at least one of a powdered stone, powdered metal, insulated coated powdered metal, moisture absorbing material, a particulate of a phase change material, and powdered polymer.

7. An apparatus according to claim 6; wherein the adhesive encapsulates small domains of the phase change particulate and prevents a quantity of the phase change material from flowing to the extent where the phase change material would cause a separation or degradation of the direct electrical communication of the bare die electronic device with said at least one of the bottom electrically conductive surface and the top electrically conductive surface.

8. An apparatus according to claim 1; wherein the adhesive has strength improving fibers incorporated within an adhesive bulk.

9. An apparatus according to claim 5; wherein the adhesive comprises a two part epoxy having finely divided soapstone heat absorbing particulate.

10. An apparatus, comprising:
a substrate having a top electrically conductive surface disposed on a top of the substrate, where the substrate includes a connection land in electrical communication with the conductive surface, each connection land including an electrically conductive phase change material disposed thereon;
a superstrate having a bottom electrically conductive surface disposed on a bottom of the superstrate; a bare die electronic device having a top conductor and a bottom conductor, the top conductor in electrical communication with the bottom electrically conductive surface and the bottom conductor in electrical communication with the top conductive surface through the electrically conductive phase change material, wherein if the bare die electronic device is driven with a wattage causing a temperature of the bottom conductor to reach a melting point of the phase change material at least a portion of the phase change material between the bottom conductor and the top electrically conductive surface melts to remove heat from the bare die LED by transferring heat energy from the bottom conductor through the phase change material to the top electrically conductive surface.

11. An apparatus according to claim 10; wherein at least a portion of the top electrically conductive surface comprises the electrically conductive phase change material.

12. An apparatus according to claim 10; wherein the electrically conductive phase change material has a melting point that is less than a maximum operating temperature of an operating temperature range of the bare die electronic device.

13. An apparatus according to claim 10; wherein the melting point of the electrically conductive phase change material is chosen so that if the bare die LED is pulse driven with a pulse duration and pulse wattage and during the pulse duration the pulse wattage causes the temperature of the bottom conductor to reach the melting point of the phase change material at least a portion of the phase change material melts to remove heat from the bare die LED by transferring heat energy from the bottom conductor through the phase change material to the top electrically conductive surface.

14. An apparatus according to claim 10; wherein at least one of the top substrate and the bottom substrate comprises a heat absorbing composite material including a binder having heat absorbing particulate.

15. An apparatus according to claim 14; wherein the heat absorbing particulate includes at least one of a powdered stone, powdered metal, insulated coated powdered metal, moisture absorbing material and powdered polymer.

16. An apparatus according to claim 10; wherein the electrically conductive phase change material is diffused into the heat absorbing composite material.

17. An apparatus according to claim 16; wherein the heat absorbing composite material having the diffused electrically conductive phase change material formed by printing or otherwise disposing the electrically conductive phase change material on the surface of the binder while uncured.

18. An apparatus, comprising:
a rigid substrate having a bottom electrically conductive surface disposed on a top of the substrate;
a superstrate having a top electrically conductive surface disposed on a bottom of the superstrate;
a bare die electronic device having a top conductor and a bottom conductor, at least one of the top conductor in direct electrical communication with the bottom electrically conductive surface and the bottom conductor in direct electrical communication with the top conductive surface, wherein during operation the bare die electronic device generates heat having an operating temperature range; and a clamp for urging the substrate towards the superstrate so that the bare die electronic device is retained in electrical communication with at least one of the bottom electrically conductive surface and the top electrically conductive surface, wherein the clamp has an urging force effective to prevent a separation of the electrical communication of the bare die electronic device with said at least one of the bottom electrically conductive surface and the top electrically conductive surface.

19. An apparatus according to claim 18; wherein bottom conductor is in electrical contact with the top conductive surface through an electrically conductive phase change material, wherein if the bare die electronic device is driven with a wattage causing a temperature of the bottom conductor to reach a melting point of the phase change material at least a portion of the phase change material between the bottom conductor and the top electrically conductive surface melts to remove heat from the bare die LED by transferring heat energy from the bottom conductor through the phase change material to the top electrically conductive surface.

20. An apparatus according to claim 18; further comprising non-conductive heat absorbing layer disposed in direct thermal contact with at least one surface of the bare die electronic device to absorb at least a portion of the heat generated as the bare die electronic device reaches its operating temperature to lessen thermal shocks to individual component structures of the bare die device, mechanical connections between the individual component structures of the bare die device, individual component structures of the apparatus, and mechanical connections between the individual component structures of the apparatus.

21. An apparatus according to claim 20, wherein the non-conductive heat absorbing layer comprises a phase change material.

* * * * *